(12) United States Patent
Yau et al.

(10) Patent No.: US 9,730,321 B2
(45) Date of Patent: *Aug. 8, 2017

(54) SILVER PLATING IN ELECTRONICS MANUFACTURE

(71) Applicant: Enthone Inc., West Haven, CT (US)

(72) Inventors: Yung-Herng Yau, Allentown, PA (US); Thomas B. Richardson, Killingworth, CT (US); Joseph A. Abys, Guilford, CT (US); Karl F. Wengenroth, Stratford, CT (US); Anthony Fiore, Wethersfield, CT (US); Chen Xu, New Providence, NJ (US); Chonglun Fan, Portland, OR (US); John Fudala, Cheshire, CT (US)

( * ) Notice: Subject to any disclaimer, the term of this patent is extended or adjusted under 35 U.S.C. 154(b) by 332 days.

This patent is subject to a terminal disclaimer.

(21) Appl. No.: 14/666,990

(22) Filed: Mar. 24, 2015

(65) Prior Publication Data
US 2015/0257264 A1    Sep. 10, 2015

Related U.S. Application Data

(60) Continuation of application No. 13/735,779, filed on Jan. 7, 2013, now Pat. No. 8,986,434, which is a
(Continued)

(51) Int. Cl.
*H05K 1/09* (2006.01)
*C23C 18/40* (2006.01)
(Continued)

(52) U.S. Cl.
CPC .............. *H05K 1/09* (2013.01); *C09D 1/00* (2013.01); *C23C 18/16* (2013.01); *C23C 18/42* (2013.01);
(Continued)

(58) Field of Classification Search
CPC ......... C23C 18/54; C23C 18/16; C23C 22/06; C23C 22/58; C23C 18/44; C23C 18/42;
(Continued)

(56) References Cited

U.S. PATENT DOCUMENTS 3,294,578 A    12/1966  Popeck
3,839,165 A    10/1974  Strauss et al.
(Continued)

FOREIGN PATENT DOCUMENTS

DE    4316679    7/1994
EP    0081183 A1    6/1983
(Continued)

OTHER PUBLICATIONS

Yau, Yung-Hern, The Chemistry and Properties of a Newly Developed Immersion Silver Coating for PWB; Feb. 24, 2004.
(Continued)

*Primary Examiner* — William Cheung
(74) *Attorney, Agent, or Firm* — Carmody Torrance Sandak & Hennessey LLP

(57) ABSTRACT

Compositions and methods for silver plating onto metal surfaces such as PWBs in electronics manufacture to produce a silver plating which is greater than 80 atomic % silver, tarnish resistant, and has good solderability.

20 Claims, 23 Drawing Sheets

Related U.S. Application Data division of application No. 10/902,398, filed on Jul. 29, 2004, now Pat. No. 8,349,393.

(51) Int. Cl.

| | | |
|---|---|---|
| *H01B 1/02* | (2006.01) | |
| *C23C 22/06* | (2006.01) | |
| *C23C 22/58* | (2006.01) | |
| *C23C 18/44* | (2006.01) | |
| *C23C 18/42* | (2006.01) | |
| *C25D 3/64* | (2006.01) | |
| *C25D 3/56* | (2006.01) | |
| *C25D 3/46* | (2006.01) | |
| *C23C 18/54* | (2006.01) | |
| *H05K 3/24* | (2006.01) | |
| *C09D 1/00* | (2006.01) | |
| C23C 18/16 | (2006.01) | |
| H05K 3/42 | (2006.01) | |

(52) U.S. Cl.
CPC .............. *C23C 18/44* (2013.01); *C23C 18/54* (2013.01); *C23C 22/06* (2013.01); *C23C 22/58* (2013.01); *C25D 3/46* (2013.01); *C25D 3/56* (2013.01); *C25D 3/64* (2013.01); *H05K 3/244* (2013.01); *C23C 18/1614* (2013.01); *C23C 18/1616* (2013.01); *C23C 18/1633* (2013.01); *C23C 18/1683* (2013.01); *C23C 18/1687* (2013.01); *H05K 3/422* (2013.01); *H05K 2203/0257* (2013.01); *H05K 2203/073* (2013.01); *Y10S 205/916* (2013.01)

(58) Field of Classification Search
CPC ............ C23C 18/1614; C23C 18/1633; C23C 18/1616; C23C 18/1687; C09D 1/00; H05K 1/09; H05K 3/244; H05K 2203/0257; H05K 2203/073; C25D 3/64; C25D 3/56; C25D 3/46; Y10S 205/916
USPC .......................... 174/257; 106/1.23; 252/514
See application file for complete search history.

(56) References Cited

U.S. PATENT DOCUMENTS

| | | |
|---|---|---|
| 3,993,845 A | 11/1976 | Greenberg et al. |
| 4,067,784 A | 1/1978 | Leahy et al. |
| 4,533,441 A | 8/1985 | Gamblin |
| 4,673,472 A | 6/1987 | Morrissey et al. |
| 4,777,078 A | 10/1988 | Miyabayashi |
| 4,908,241 A | 3/1990 | Quast et al. |
| 4,940,181 A | 7/1990 | Juskey, Jr. et al. |
| 4,978,423 A | 12/1990 | Durnwirth, Jr. et al. |
| 5,160,579 A | 11/1992 | Larson |
| 5,173,130 A | 12/1992 | Kinoshita et al. |
| 5,235,139 A | 8/1993 | Bengston et al. |
| 5,301,253 A | 4/1994 | Goodman |
| 5,322,553 A | 6/1994 | Mandich et al. |
| 5,348,509 A | 9/1994 | Riccardi et al. |
| 5,468,515 A | 11/1995 | Ferrier et al. |
| 5,470,820 A | 11/1995 | Hauser et al. |
| 5,480,576 A | 1/1996 | Gary et al. |
| 5,567,357 A | 10/1996 | Wakita |
| 5,601,696 A | 2/1997 | Asakawa |
| 5,662,168 A | 9/1997 | Smith |
| 5,733,599 A | 3/1998 | Ferrier et al. |
| 5,843,517 A | 12/1998 | Ferrier et al. |
| 5,882,736 A | 3/1999 | Stein et al. |
| 5,935,640 A | 8/1999 | Ferrier et al. |
| 5,955,141 A | 9/1999 | Soutar et al. |
| 6,020,021 A | 2/2000 | Mallory, Jr. |
| 6,099,713 A | 8/2000 | Yanada et al. |
| 6,120,639 A | 9/2000 | Redline et al. |
| 6,121,150 A | 9/2000 | Avanzino et al. |
| 6,127,102 A | 10/2000 | Geuens et al. |
| 6,133,018 A | 10/2000 | Wu et al. |
| 6,158,491 A | 12/2000 | Reynolds et al. |
| 6,183,545 B1 | 2/2001 | Okuhama et al. |
| 6,200,451 B1 | 3/2001 | Redline et al. |
| 6,319,543 B1 | 11/2001 | Soutar et al. |
| 6,344,157 B1 | 2/2002 | Cheng et al. |
| 6,375,822 B1 | 4/2002 | Taytsas |
| 6,387,542 B1 | 5/2002 | Kozlov et al. |
| 6,395,329 B2 | 5/2002 | Soutar et al. |
| 6,444,109 B1 | 9/2002 | Redline et al. |
| 6,451,443 B1 | 9/2002 | Daech |
| 6,472,023 B1 | 10/2002 | Wu et al. |
| 6,527,840 B1 | 3/2003 | Igarashi et al. |
| 6,544,397 B2 | 4/2003 | Redline et al. |
| 6,773,757 B1 | 8/2004 | Redline et al. |
| 6,991,675 B2 | 1/2006 | Suda et al. |
| 8,986,434 B2 * | 3/2015 | Yau .......................... C23C 18/54 106/1.19 |
| 2002/0113695 A1 | 8/2002 | Ernst et al. |
| 2002/0150692 A1 | 10/2002 | Soutar et al. |
| 2002/0152925 A1 | 10/2002 | Soutar et al. |
| 2002/0153260 A1 | 10/2002 | Egli et al. |
| 2003/0000846 A1 | 1/2003 | Rzeznik et al. |
| 2003/0038035 A1 | 2/2003 | Wilson et al. |
| 2003/0118742 A1 | 6/2003 | Redline et al. |
| 2003/0207974 A1 | 11/2003 | Kubik et al. |
| 2003/0209446 A1 | 11/2003 | Redline et al. |
| 2004/0040852 A1 * | 3/2004 | Rzeznik ................. H05K 3/244 205/86 |
| 2004/0043159 A1 | 3/2004 | Rzeznik et al. |
| 2004/0217009 A1 | 11/2004 | Mikkola et al. |

FOREIGN PATENT DOCUMENTS

| | | |
|---|---|---|
| EP | 1327700 A1 | 7/2003 |
| EP | 0797380 B1 | 4/2004 |
| GB | 2201163 A | 8/1988 |
| JP | 4-110474 | 4/1992 |
| JP | H10-130855 | 5/1998 |
| JP | 10237665 A | 9/1998 |
| JP | 2002356783 | 12/2002 |
| JP | 2003293147 | 10/2003 |
| JP | 2004190142 | 7/2004 |
| WO | 96/17974 | 6/1996 |
| WO | 96/17975 | 6/1996 |
| WO | 02/29132 | 4/2002 |
| WO | 2004007798 | 1/2004 |

OTHER PUBLICATIONS

Russev, D., Radev, D. and Karaivanow, S., Immersion Silvering of Copper, "1252 Metal Finishing", vol. 81, No. 1, (Jan. 1983) pp. 27-30.

Geld, I., Finishing Pointers: Silver Plating of Electrical Contacts by Immersion, "Metal Finishing", (Aug. 1960), p. 53.

Lowenheim, F.A., "Modem Electroplating", London: John Wiley & Sons, 1963, pp. 337 and 608-611.

Replication Test of Igarashi et al. dated Oct. 27, 2008, 3 pages.

* cited by examiner

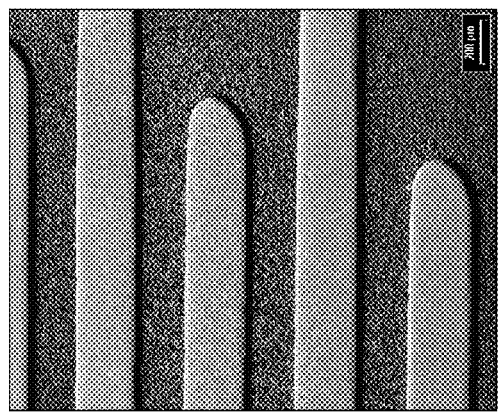
FIG. 14C 1000X original
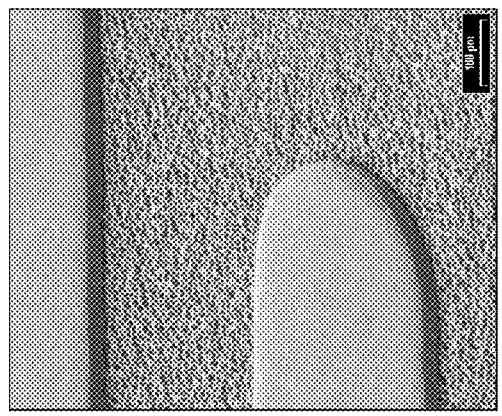
FIG. 14B 150X original
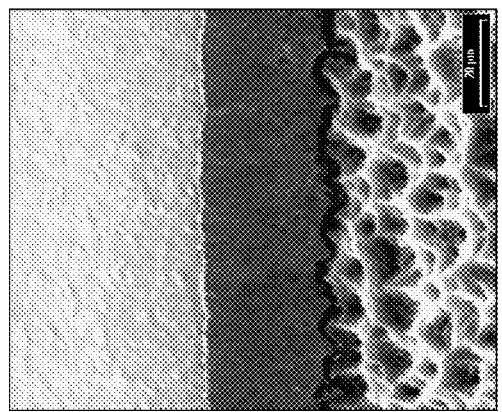
FIG. 14A 50X original 4mil

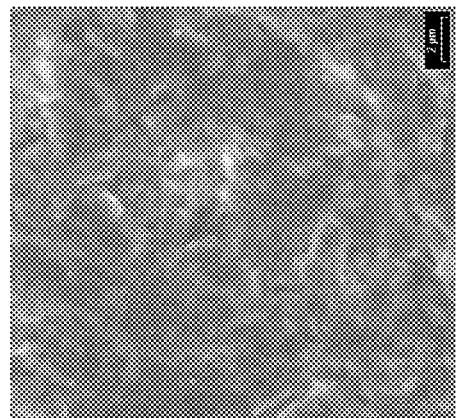
FIG. 29C  18 MTO
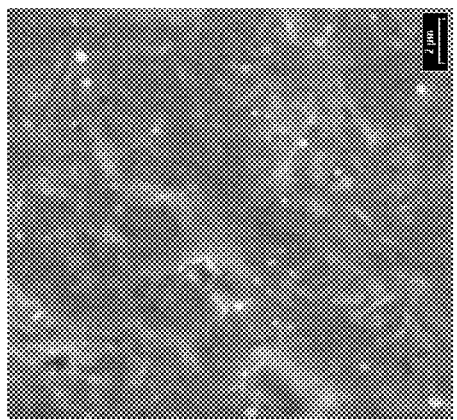
FIG. 29B  7 MTO
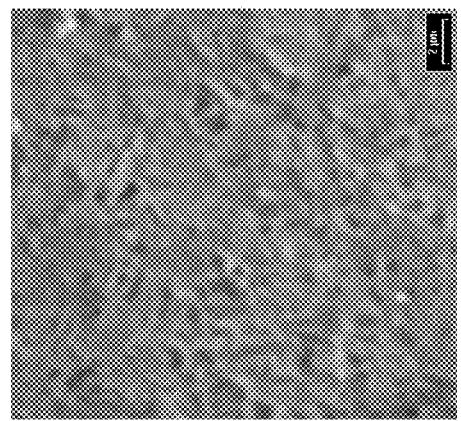
FIG. 29A  0.6 MTO

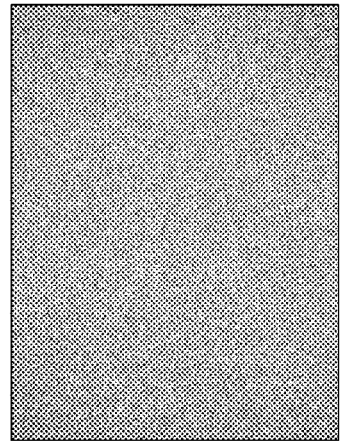
FIG. 30A 0.6 MTO
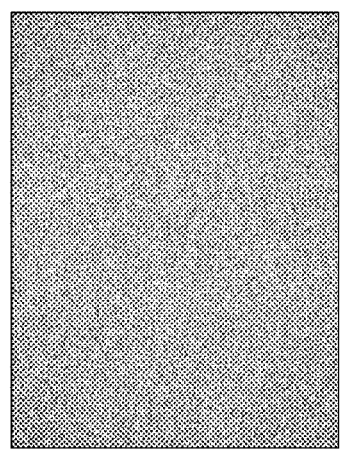
FIG. 30B 7 MTO
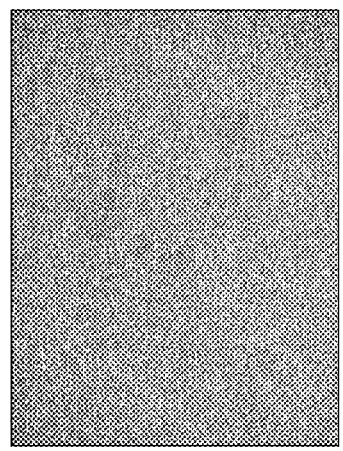
FIG. 30C 18 MTO 2KX original 5KX original 100X original 500X original

SILVER PLATING IN ELECTRONICS MANUFACTURE

CROSS-REFERENCE TO RELATED APPLICATIONS

This application is a continuation of U.S. patent application Ser. No. 13/735,779, filed Jan. 7, 2013, issued as U.S. Pat. No. 8,986,434 on Mar. 24, 2015, which is a divisional of U.S. application Ser. No. 10/902,398, filed Jul. 29, 2004, issued as U.S. Pat. No. 8,349,393 on Jan. 8, 2013, each of which is incorporated herein by reference in its entirety.

FIELD OF THE INVENTION

In the production of a printed wiring board (PWB), in a first (multi-step) stage a "bare board" is prepared and in a second (multi-step) stage, various components are mounted on the board. The present invention relates to the final steps in the manufacture of the bare board, in which the bare board is coated with a protective layer prior to passing to the second production stage.

BACKGROUND

There are currently two types of components for attachment to the bare boards in the second stage referred to above: legged components e.g. resistors, transistors, etc., and, more recently, surface mount devices. Legged components are attached to the board by passing each of the legs through a hole in the board and subsequently ensuring that the hole around the leg is filled with solder. Surface mount devices are attached to the surface of the board by soldering with a flat contact area or by adhesion using an adhesive.

In the first stage referred to above, a board comprising an insulating layer, a conducting circuit pattern and conductive pads and/or through-holes is produced. The board may be a multi-layer board having more than one conducting circuit pattern positioned between insulating layers or may comprise one insulating layer and one conducting circuit pattern.

The through-holes may be plated through so that they are electrically conducting and the pads which form the areas to which the surface mount components will be attached in the subsequent component-attachment stage, are also electrically conducting.

The conductive areas of the circuit pattern, pads and through-holes may be formed from any conductive material or mixtures of different conductive materials. They are generally however, formed from copper. Since over time copper tends to oxidise to form a copper oxide layer with poor solderability, prior to passing to the second, component-attachment stage, a protective layer is coated over the pads and/or through-hole areas where it is desired to retain solderability to prevent formation of a poorly solderable surface layer of copper oxide. While there is more than one way for preparing the bare boards, one of the most widely used processes for making the bare boards is known as the "solder mask over bare copper" (SMOBC) technique. Such a board generally comprises an epoxy-bonded fiberglass layer clad on one or both sides with conductive material. Generally, the board will be a multi-layer board having alternate conductive layers which comprise circuit pattern, and insulating layers. The conductive material is generally metal foil and most usually copper foil. In the SMOBC technique, such a board is obtained and holes are drilled into the board material using a template or automated drilling machine. The holes are then "plated through" using an electroless copper plating process which deposits a copper layer on the entirety of the board: both on the upper foil surfaces and on the through-hole surfaces.

The board material is then coated with a light sensitive film (photo-resist), exposed to light in preselected areas and chemically developed to remove the unexposed areas revealing the conductive areas which are the plated through-holes and pads. Generally, in the next step, the thickness of the metal foil in the exposed areas is built up by a further copper electroplating step. A protective layer of an etch resist, which is usually a tin or tin-lead alloy is applied over the exposed and thickened copper areas.

The photo-resist is then removed exposing the copper for removal and the exposed copper surface is etched away using a copper etching composition to leave the copper in the circuit pattern finally required. In the next step, the tin or tin-lead alloy resist is stripped away.

Since components will not be attached to the copper circuit traces, it is generally only necessary to coat the solder for attaching the components over the through-hole and pad areas but not the traces. Solder mask is therefore applied to the board to protect the areas where the solder coating is not required, for example using a screen printing process or photo-imaging technique followed by development and, optionally curing. The exposed copper at the holes and pads is then cleaned and prepared for solder coating and the protective solder coating subsequently applied, for example by immersion in a solder bath, followed by hot air leveling (HAL) to form a protective solder coating on the areas of copper not coated with solder mask. The solder does not wet the solder mask so that no coating is formed on top of the solder mask protected areas. At this stage, the board comprises at least one insulating layer and at least one conductive layer. The conductive layer or layers comprise a circuit trace. The board also comprises a pad or pads and/or through-hole(s) protected from tarnishing by a layer of solder. A single conductive layer may comprise either a circuit trace or pad(s), or both. Any pads will be part of a conductive layer which is an outerlayer of a multi-layer board. The circuit traces on the board are coated with solder mask.

Such a board is ready to proceed to the second stage for attachment of the components. In this second stage, generally attachment of the components is achieved using solder: firstly a layer of solder paste (comprising solder and flux) is applied onto the boards, generally by printing and the components are positioned on the printed boards. The board is then heated in an oven to produce fusion of the solder in the solder paste, which forms a contact between the components and the board. This process is known as reflow soldering. Alternatively a wave soldering process is used in which the board is passed over a bath of molten solder. In either case additional solder is used over and above any protective solder coating.

The additional complications of attaching both legged components and the surface mount devices and the special requirements for mounting many small closely spaced components have resulted in increased demands on the surface protection coating for the conductive metal to which the components will be attached on the PWBs. It is essential that the finish applied by the bare board manufacturer does not leave a pad with an uneven surface as this increases the risk of electrical failure. It is also essential that the protective coating does not interfere with the subsequent solder step, thereby preventing formation of a good, conducting bond between the bare board and components. An extra step in which the protective coating is removed would be undesirable.

As explained above, the conductive metal surfaces are generally formed of copper and the protective surface must be applied at the end of the first stage to prevent the formation of non-solderable copper oxide on the copper surfaces prior to the component attachment. This is particularly important because, generally speaking, the first stage and the second, component-attachment stage will be carried out at completely different sites. There may therefore be a considerable time delay between formation of conducting pads and/or through-holes and the component-attachment stage, during which time oxidation may occur. Therefore, a protective coating is required which will retain the solderability of conducting material and enable a soldered joint to be made when the components are attached to the bare boards.

The most common protection coating presently used is tin/lead solder, generally applied using the "HASL" (hot air solder leveling) process, an example of which is described in detail above. HASL processes are limited because it is difficult to apply the solder evenly and the thickness distribution produced by the use of HASL processes makes it difficult to reliably attach the very small and closely spaced components now being used.

Several replacement treatments for the HASL coating of a solder layer are being introduced. The coatings must enable formation of a reliable electrical contact with the component. They should also be able to stand up to multiple soldering steps. For example, as described above, there are now both legged and surface mount components for attachment to the bare boards and these will generally be attached in at least two soldering operations. Therefore, the protective coatings must also be able to withstand at least two soldering operations, so that the areas to be soldered in a second operation remain protected after the first operation.

Alternatives to the tin/lead alloy solder used in the HASL process, which have been proposed include organic protection, immersion tin or tin/lead plating and nickel/gold plating. In the nickel/gold process electroless plating of the copper surfaces is carried out in which a primer layer of nickel is applied onto the copper followed by a layer of gold. This process is inconvenient because there are many process steps and in addition, the use of gold results in an expensive process.

Organic protection for the copper pads during storage and assembly prior to soldering have also been effected using flux lacquer. Its use is generally confined to single-sided boards (i.e. boards which have conductive pads on only one side). The coating is generally applied by dip, spray or roller coating. Unfortunately, it is difficult to provide a consistent coating to the board surfaces so limited life expectancy, due to the porosity of the coating and to its inconsistent coating thickness, results. Flux lacquers have also been found to have a relatively short shelf life. A further problem is that in the component-attachment stage, if reflow soldering is to be used to attach the components, the components are held in place on the underside of the boards with adhesive. In cases where the flux lacquer is thick, the adhesive does not bond the component directly to the printed board, but instead forms a bond between the adhesive and the lacquer coating. The strength of this bond can drop during the fluxing and soldering step causing components to be lost during contact with the solder baths. One other alternative currently being used is passivation/protection treatment based upon the use of imidazoles or triazoles in which copper-complex compounds are formed on the copper surface. Thus, these coatings chemically bond to the surface and prevent the reaction between copper and oxygen. However this process is disadvantageous because it tends to be inadequate for withstanding successive soldering steps so that the high temperatures reached in a first soldering step tend to destroy the layer which cannot withstand a subsequent soldering operation needed to mount further components. One example of such a process is given in EP-A-0428383, where a process is described for the surface treatment of copper or copper alloys comprising immersing the surface of copper or copper alloy in an aqueous solution containing a benzimidazole compound having an alkyl group of at least 3 carbon atoms at the 2-position, and an organic acid. Processes are also known which provide coatings using compositions which comprise silver. Among complexing systems for electroless silver plating processes are ammonia-based, thiosulphate-based, and cyanide-based. The ammonia systems are disadvantageous because the ammonia-containing silver solutions are unstable and explosive azides may tend to form. Thiosulphate systems are disadvantageous for use in the electronics industry because sulphur compounds in the silver coatings formed result in poor solderability so that in the subsequent component-attachment step, a poor electrical contact may be formed between the bare board and the component. The cyanide-based systems are disadvantageous due to the toxicity of the plating solutions.

In U.S. Pat. No. 5,318,621 an electroless plating solution containing amino acids as rate enhancers for depositing silver or gold onto a nickel coating overlying copper on a circuit board is disclosed. It is described that neither gold nor silver electroless plating baths based on thiosulphate/sulphate will plate directly onto copper because the copper rapidly dissolves without allowing a silver or gold coating to form. In the introduction of the reference, "Metal Finishing Guidebook & Directory" (1993 edition), silver plating solutions comprising silver nitrate, ammonia and a reducing agent such as formaldehyde are mentioned.

U.S. Pat. No. 4,863,766 also discloses electroless silver plating, using a cyanide-based plating solution. In Metal Finishing (1983) 81(i), pp 27-30 Russev described immersion silvering of copper powder from a plating solution containing silver nitrate and a nitrogen complexing agent. In Metal Finishing (1960) August, p 53 Geld described a silver coating process involving an initial bright dip of the brass or copper substrate, followed by a silver plating step in which a thick coating of silver is plated from a solution of silver nitrate and potassium iodide. The process is for plating of electrical contacts to increase conductivity.

In JP-A-04-110474 a base material is plated with silver, dried and subsequently treated with a mercaptan compound to prevent tarnish.

In DE-C-4316679 base metals such as copper are coated with palladium in a two-step process including a first step in which the surface is contacted with a bath containing a palladium salt and an oxidizing agent, and in the second step with a bath containing a palladium salt, a complexing agent and formic acid or formic acid derivative. The latter bath may also contain stabilizers for the bath itself, which stabilize the bath against decomposition or "plating-out". It is suggested that the copper substrate should previously be etched using a non-bright etch bath including persulphate. However, such pretreatment steps tend to produce relatively porous coatings. The inventors there minimize the porosity of the coating by using the two-step process in the first of which a very thin coating is formed. This reference warns against using silver as corrosion protection due to migration.

It is reported in for example "Modern Electroplating" by F. A. Lowenheim, published by J. Wiley & Sons (1963) that silver will plate by displacement on most base metals but that immersion plated silver is poorly adherent. F. A. Lowenheim suggests that when electroplating base metals with silver, it is necessary to deposit first a thin film of silver on the work piece from a high-cyanide strike bath to ensure good adhesion of the subsequent electroplated silver layer.

U.S. Pat. No. 6,395,329 discloses an immersion plating process for plating silver onto copper which operates at a preferred pH range of 4 to 7. U.S. Pat. No. 6,200,451 also discloses an immersion silver plating process.

SUMMARY OF THE INVENTION

Briefly, therefore, the invention is directed to a process and composition for Ag plating a metal surface comprising contacting the metal surface with a composition comprising a source of Ag ions and water to thereby form a Ag-based coating on the metal surface, wherein the ionic content of the composition is such that it has a room temperature conductivity below about 25 mS/cm.

In another aspect the invention is directed to a process and composition for Ag plating a metal surface comprising contacting the metal surface with a composition comprising a source of Ag ions, an alkylene polyamine polyacetic acid compound, and water, wherein the composition has a pH between 1 and about 3, to thereby form a Ag-based coating on the metal surface.

The invention also encompasses a process and composition for Ag plating a metal surface comprising contacting the metal surface with a composition comprising a source of Ag ions, an amino acid inhibitor of Ag deposition which slows Ag deposition rate, and water, to thereby form a Ag-based coating on the metal surface by displacement plating under plating conditions where metal of the metal surface functions as a reducing agent for the Ag ions.

In a further aspect the invention is directed to a process and composition for Ag plating a metal surface comprising contacting the metal surface with a composition comprising a source of Ag ions, an amino acid selected from the group consisting of chiral isomers of and racemic mixtures of alanine, and water, to thereby form a Ag-based coating on the metal surface.

The invention is also directed to a process and composition for Ag plating a metal surface comprising contacting the metal surface with a composition comprising a source of Ag ions, a hydantoin derivative, water, to thereby form a Ag-based coating on the metal surface.

Among other aspects are a process and composition for Ag plating a metal surface comprising contacting the metal surface with a composition comprising a source of Ag ions, an ethylene oxide/propylene oxide block co-polymer additive, and water, to thereby form a Ag-based coating on the metal surface.

The invention is further directed to a process and composition for Ag plating a metal surface comprising contacting the metal surface with a composition comprising a source of Ag ions, an alkaline earth/alkali metal-free source of alkylene polyamine polyacetic acid compound, and water, to thereby form a Ag-based coating on the metal surface.

In another aspect the invention is a process for Ag plating a Cu surface of a printed wiring board substrate having electrical interconnect recesses comprising sequentially a) applying a Ag plating composition comprising a source of Ag ions to the Cu surface, and b) mechanically assisting the Ag plating composition into the electrical interconnect recesses.

The invention is also directed to a printed wiring board having Cu interconnects therein having a surface coating on the Cu interconnects which comprises at least about 80 atomic % Ag.

Other objects and aspects of the invention will be in part apparent and in part pointed out hereinafter.

BRIEF DESCRIPTION OF THE DRAWINGS

FIGS. 14A, 14B, 14C, 15, 16, 17, 18, 19, 20, 21, 22 and 23 are photographs of Ag coatings.

FIGS. 29A, 29B, 29C, 30A, 30B and 30C are SEM photomicrographs of Ag deposits.

DETAILED DESCRIPTION OF PREFERRED EMBODIMENTS

Figure 1:
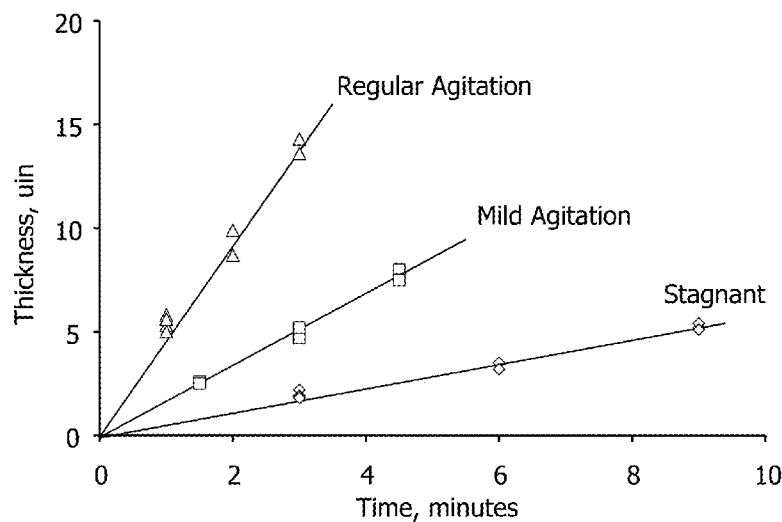
FIGS. 1 and 2 are plots of coating thickness v. coating time.

The invention is directed to a displacement metal plating process in which a relatively less electropositive base metal is plated with a relatively more electropositive coating metal by contact with an aqueous plating composition containing ions of the more electropositive metal and other additives as described herein so as to form a coating of the more electropositive metal. Ions of the more electropositive metal oxidize the substrate metal. A displacement plating process differs from an electroless process because the coating forms on the surface of a metal by a simple displacement reaction due to the relative electrode potentials of the oxidizable metal of the surface to be protected and of the depositing ions respectively.

The insulating layer and conducting layer of a PWB substrate to which the invention is applied are as described above. They may comprise the insulating layer and conducting circuit pattern of any conventional PWB, respectively. The pads and/or through-holes for plating are those areas of the PWB for which solderability must be maintained for attachment of components in the subsequent soldering steps for component attachment.

A bright-etch step is optionally performed which comprises contacting the pads and/or through-holes with a bright-etch composition. Such compositions are already known in the industry and they produce a bright smooth cleaned surface on the conducting metal from which the pads and/or through-holes are formed. In contrast, non-bright etch compositions, such as those which are based on persulphate provide microroughened, cleaned surfaces. The use of the bright-etch step allows the formation of a dense, nonporous metal coating, which is particularly suitable for a subsequent soldering step.

Suitable bright-etch compositions are generally aqueous and may be based for example on one or mixtures of more than one of hydrogen peroxide, sulphuric acid, nitric acid, phosphoric acid or hydrochloric acid. The bright-etch compositions generally include at least one component which will tend to modify the dissolution of copper in bright-etch compositions. Particularly preferred bright-etch compositions, if one elects to use one, where the metal surface of the pads and/or through-holes comprises copper or a copper alloy are, for example, hydrogen peroxide/sulphuric acid with a stabilizer that slows down the decomposition of hydrogen peroxide. Thus, any etch composition which provides a bright, cleaned surface may be used. In the bright-etch step, contact with the bright-etch composition may be by immersion, spray, or other coating technique, for sufficient time and at a suitable temperature to enable a bright surface to form on the conducting material of the pads and/or through-holes. Generally the temperature for contact with the bright-etch composition will be ambient and the contact time will be from 5 seconds to 10 minutes, preferably at least 30 seconds, or even at least 2 minutes, and preferably for no greater than 5 minutes. Generally after the etching step, there will be a post-rinse step comprising rinsing with deionized water and generally without drying, the bare boards then proceed directly to the plating step. Alternatively, an acid rinse step may be included, before the aqueous rinse.

The plating process of the invention is an immersion displacement process, in contrast to a true electroless plating process. In immersion plating, also known as displacement plating, a metal on a surface is displaced by a metal ion in an immersion solution. The driving force is a lower oxidation potential of the metal ion in the solution. In immersion plating, the base metal on the surface functions as the reducing agent. The reaction of Ag immersion plating onto Cu is as follows:

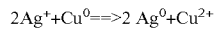

$$2Ag^+ + Cu^0 ==> 2\,Ag^0 + Cu^{2+}$$

Immersion plating therefore differs from electroless plating in that a further reducing agent is not required. Another distinction is that in immersion plating the plating stops once the surface is covered with the metal being deposited. In this regard it is self-limiting because when plated metal covers all of the surface sites of metal oxidizable by the plating metal, no further reaction and therefore no further deposition occurs. In contrast, electroless plating is auto-catalytic, and continues as long as there is ample reducing agent in the solution.

In the preferred plating compositions of the present invention, metal atoms on the surface of the metal are oxidized by the metal plating ions in the solution, so that a layer of plated metal deposits on the pads and/or through-holes. The plating composition comprises metal ions of a metal which is more electropositive than the conducting material. In this embodiment of the invention, the metal deposited is silver.

The plating composition of the invention comprises a source of silver ions, a tarnish inhibitor, and a deposition modulating agent. Additional optional components include a grain refiner, a surfactant, and an acid.

As sources of silver ions, any water soluble silver salt may be used. Preferably silver nitrate is used. The ions are in the plating composition at a concentration of from about 0.01 to about 2 g/l (based on metal ions), preferably from about 0.1 to about 1.5 g/l, most preferably from about 0.3 to about 0.8 g/l.

The currently preferred tarnish inhibitors are benzimidazoles, especially alkylaryl benzimidazoles in which the alkyl group has up to 22 carbon atoms, preferably no greater than 10 carbon atoms and in which the alkyl or benzyl groups are optionally substituted, for example 2-(p-chlorobenzyl) benzimidazole. Other tarnish inhibitors are listed in U.S. Pat. No. 6,395,329:

(a) fatty acid amines, preferably having at least 6 carbon atoms, most preferably at least 10 carbon atoms and generally no greater than 30 carbon atoms, they may be primary, secondary, tertiary, diamines, amine salts, amides, ethoxylated amines, ethoxylated diamines, quaternary ammonium salts, quaternary diammonium salts, ethoxylated quaternary ammonium salts, ethoxylated amides and amine oxides. Examples of the primary, secondary and tertiary amine-type corrosion inhibitors are ARMEEN™ to (™ denotes trademark). Examples of the subsequent amine-type corrosion inhibitors are respectively DUOMEENJ, ARMACJ/DUOMAC, ARMIDJ, ETHOMEENJ, ETHODUONEENJ, ARQUADJ, DUOQUADJ, ETHOQUADJ, ETHOMIDJ, AROMOXJ, all supplied by Akzo Chemie.

(b) purines and substituted purines.

(c) N-acyl derivatives of sarcosine, such as the SARKOSY range of products supplied by Ciba-Geigy.

(d) organic polycarboxylic acids such as Reocor 190 supplied by Ciba-Geigy.

(e) substituted imidazoline in which substituents are for example hydroxyl C.sub.1-4 alkyl amino or carbonyl-containing groups. Examples include AMINE 0, produced by Ciba-Geigy, especially in combination with a N-acyl sarcosine of category (c).

(f) alkyl or alkyl benzyl imidazoles, e.g. undecyl imidazole in which the alkyl group has up to 22 carbon atoms, preferably no greater than 11 carbon atoms and in which the alkyl or benzyl groups are optionally substituted.

(g) phosphate esters such as EKCOL PS-413, supplied by Witco.

(h) optionally substituted triazole derivatives such as REOMET 42, supplied by Ciba-Geigy. Examples are benzo triazole, tolyl triazole and alkyl substituted triazole derivatives having a carbon number on the alkyl group of from 1 to 22, preferably from 1 to 10.

(i) substituted tetrazoles, such as 5(3(trifluoromethyl phenyl))tetrazole, is also a preferred example.

The tarnish inhibitor is preferably water soluble so that the solution is an aqueous solution. However, water immiscible tarnish inhibitors may be used although it may be necessary to include a surfactant/cosolvent in the solution.

This invention incorporates a deposition modulating agent into the composition in order to regulate deposition of the silver. It has been discovered that by regulating the deposition in accordance with the invention, coatings can be obtained which are on the order of greater than about 80 atomic % Ag, even greater than about 90 atomic % Ag, and even greater than about 95 atomic % Ag. This is in comparison to previous coatings which were on the order of 70 at. % Ag and 30 at. % organic additives. Without being bound to a particular theory, it is thought that the coating is less porous and entrainment of organic compounds from the bath into the coating is minimized because the deposition process is less aggressive. The modulated nature of the deposition allows it to proceed in a more orderly manner, with, in theory, each deposited silver atom having an opportunity to, within reason, find its deposition location of greatest equilibrium. It is speculated that the modulator component cyclically desorbs and absorbs on Cu by weak forces (ionic or van der Waal's). This interferes with the Ag deposition, thereby modulating it.

The component HEDTA (N-(2-hydroxyethyl)ethylenediamine triacetic acid) has been discovered to function as a modulator in the concentrations and at the operational pH of the invention. It has been discovered that under the parameters of the invention, the HEDTA does not function as a chelator for Ag ions, nor does it function simply as an acid to help keep Ag in solution. The invention involves maintaining the immersion composition pH below about 3. The initial pH is about 2, and it falls during coating to a pH between 1 and 2, because as the HEDTA complexes a quantity of the Cu ions entering the solution from the substrate upon displacement by Ag, H ions are released. At this pH, the HEDTA appears to cyclically desorb and absorb on the Cu substrate by weak forces, which interferes with the Ag deposition, thereby modulating it. The HEDTA is in the plating composition at a concentration of from about 1 to about 35 g/l, preferably from about 5 to about 25 g/l, most preferably from about 8 to about 15 g/l. Other alkylene polyamine polyacetic acid compounds such as EDTA and DTPA are expected to have a similar function at different pHs, in that they do not function in their traditional sense as a chelator for Ag, but function to complex Cu and modulate Ag deposition. As a source of the HEDTA or other modulating agent, it is preferred to employ, for example, pure HEDTA, rather than a Na salt of HEDTA, or an alkali earth metal salt of any of the modulating agents, in order to avoid further increasing the ionic content of the composition.

An alternative process of the invention employs as a modulating agent certain amino acids which are shown to act as a suppressor and inhibitor of Ag deposition. In one embodiment, these are compounds selected from among chiral isomers of and racemic mixtures of alanine. One preferred example is DL-alanine, which is shown to operate with desired suppression and inhibition at a higher pH, between about 4 and about 5. The DL-alanine modulates the Ag deposition as a suppressor/inhibitor. This yields an improved deposit with a higher Ag content. One preferred process employs $AgNO_3$ in a concentration between about 0.5 and about 1 g/L, DL-alanine in a concentration between about 20 and about 40 g/L, a hydantoin derivative such as 5,5-dimethylhydantoin in a concentration between about 5 and about 10 g/L as a chelator for Cu and for grain refinement, and Pluronic P103 in a concentration between about 0.1 and about 3 g/L as a surfactant and stabilizer. In one preferred embodiment, Pluronic P103 is employed in a concentration of 0.5 g/L.

In a preferred embodiment of the invention the plating composition also comprises a grain refiner (or brightener). Suitable examples of grain refiners include lower alcohols such as those having from 1 to 6 carbon atoms, for example isopropanol and polyethylene glycols, for example PEG 1450 (Carbowax from Union Carbide). Grain refiners may be incorporated in the composition in amounts from 0.02 to 200 g/l. More preferably, if a grain refiner is included, it will be at concentrations of from 0.05 to 100 g/l and most preferably from 0.1 to 10 g/l. Any nonaqueous solvent should be present in amounts below 50% by weight of the composition, preferably below 30% by weight or even below 10% or 5% by weight of the plating composition. One currently preferred grain refiner is 3,5 dinitrohydroxy benzoic acid (3,5 dinitro salicylic acid). This grain refiner is in the plating composition at a concentration of at least about 80 ppm. In one preferred embodiment, it is present in a concentration between about 100 and about 200 ppm. It has been discovered that this grain refiner performs a further important function as a suppressor and inhibitor for Ag deposition. In particular, the pH at which the invention operates typically corresponds to very rapid Ag deposition, which, in some circumstances, can yield an undesirably black and spongy Ag deposit. This dinitro compound has been discovered to suppress and inhibit this deposition so that it proceeds more orderly to yield a uniform and bright Ag deposit. Examples 8-15 hereinbelow employed about 150 ppm of this grain refiner. Too much grain refiner in the system can present a risk that it will precipitate out in a reaction with benzimidazole. Another suitable grain refiner is polyethyleneglycol.

The composition optionally includes a surfactant, preferably a non-ionic surfactant, to reduce surface tension. One currently preferred non-ionic is an ethylene oxide/propylene oxide block co-polymer. One such compound has about 30 PO units and about 40 EO units, such that the unit ratio of PO:EO (polyoxypropylene to polyoxyethylene) is about 3:4, +/−10%. The weight ratio of PO:EO is about 1:1. A source of this compound is BASF Corporation under the trade designation Pluronic P65. Another such compound has about 50 PO units and about 30 EO units, such that the unit ratio of PO:EO is about 5:3, +/−10%. The weight ratio of PO:EO is about 7:3. A source of this compound is BASF Corporation under the trade designation Pluronic P103. The surfactant is in the plating composition at a concentration of from about 0.1 to about 5 g/l, preferably from about 0.2 to about 2 g/l, most preferably from about 0.5 to about 1.5 g/l. Where surfactants are included, preferably they are introduced into the composition in an amount such that in the plating bath, they will be present at a concentration of from 0.02 to 100 g/l. Preferably they will be incorporated at a concentration of from 0.1 to 25 g/l, and most preferably at a concentration of from 1 to 15 g/l. Other preferred surfactants are alkyl phenol ethoxylates, alcohol ethoxylates and phenol ethoxylates such as Synperonic NP9, Synperonic A14, and Ethylan HB4 (trade names).

Another optional component of the composition is an acid, preferably nitric $HNO_3$, to enhance the in-service flexibility of the composition. The acid may be in the plating composition at a concentration of from about 0.5 to about 1 g/l, for example. The purpose of the acid is to impart a pH of about 2 at the initiation of the process, and to assist in initiation of the process. An alternative embodiment employs a small quantity (up to about 0.2 or 0.3 g/L) of copper nitrate $Cu(NO_3)_2\text{-}2.5H_2O$ to assist in initiating the process. A further alternative employs a mixture of nitric acid and copper nitrate. Once the process begins, Cu ions which enter the system from the substrate upon displacement by Ag are complexed with HEDTA. The HEDTA releases $H^+$, which causes further pH drop below 2 to between 2 and 1. For example, the pH drops to 1.1 at 2.47 g/l copper which is the capacity of 10 g/L HEDTA. Although nitric acid is currently preferred, any compatible acid may be included. A compatible acid is one with which in the amounts required in the composition do not result in the precipitation out of solution of the silver ions and/or complexing agent. For example hydrogen chloride is unsuitable for a silver plating composition as it forms an insoluble silver chloride precipitate. Suitable examples include citric acid, nitric acid, or acetic acid.

Other non-active, non-interfering components may be included such as defoamers especially for spray applications (e.g., A100 supplied by Dow), dyes, etc.

The balance in the composition is water. Deionized water or other purified water which has had interfering ions removed, is used in the plating composition used in the process of the invention.

As demonstrated in the working Examples 12 and 16, this invention achieves a substantially greater Ag content in the deposit—more than 80 atomic %, even more than 90 atomic %, and even more than 95 atomic %—than the approximately 70 to 75 atomic % Ag achieved by prior art processes. To avoid interference from the surface and from the Cu—Ag interface, the compositional Ag content is preferably evaluated by XPS as a bulk average between the surface and the beginning of the Cu—Ag interface. The deposit of the invention is therefore much lower in organic content. While in the past it has been thought that a relatively higher organic content was required in order to preserve solderability of the Ag deposit, it has now been discovered that even with the high Ag content (greater than 90 atomic %; and greater than about 95 atomic %) and low organic content of the deposit of the invention (less than 10 atomic %; and less than about 5 atomic %), solderability is preserved. Accordingly, this invention positively makes a deposit which is greater than 90 atomic % Ag, and even greater than about 95 atomic % Ag.

In one aspect the high purity Ag deposit of the invention is achieved by affirmatively maintaining a low ionic content (as measured by conductivity) in the deposition solution. The ionic content, determined as a measurement of conductivity of the fresh composition at about room temperature not yet used to plate substrates, in one embodiment is preferably below about 25 mS/cm when measured, for example, with a YSI 3200 Conductivity Instrument, and a YSI 3253 probe with a cell constant of K=1.0/cm. In one preferred embodiment it is below about 10 mS/cm. Another embodiment has a conductivity below about 5 mS/cm. One factor in achieving this is to avoid or at least minimize employing Na or other alkali earth metal salts as sources for additives. Another factor is that the overall organic additive content (cumulative modulator, suppressor/inhibitor, surfactant, and tarnish inhibitor) is maintained at moderate to low levels.

In order to form the plating composition for use in the processes of the present invention, preferably a solution is firstly prepared comprising deionized water, complexing agent as defined above, and any buffering agent, optionally with the other optional ingredients, and a salt of the more electropositive metal is added as an aqueous solution to the other components which have been formed into a pre-mix. It has been found that this is the most advantageous way to prepare the solution because trying to dissolve the metal salt directly into the plating composition is relatively time consuming and, where the metal is silver, tends to be more vulnerable to photo-reaction which results in precipitation of silver ions out of solution, as a dark precipitate.

Contact of the metal surface with the plating solution will generally be at temperatures of from 10 to 90 C, preferably 15 to 75 C, more preferably 30 to 60 C. For example, the temperature of contact with the plating solution will be from 15 to 75 C, most usually from 40 to 60 C.

Contact can be by any method, usually dip, or horizontal immersion coating. Such contact may be part of a substantially continuous coating process. The contact time of the plating solution with the metal surface is sufficient to form plated metal surfaces over the metal. Generally the contact time will be from 10 seconds to 10 minutes. A contact time of less than 10 seconds has generally been found to give insufficient coverage with silver coating and although the contact time may be longer than 10 minutes, no additional benefit has been found from a contact time of longer than 10 minutes.

In one alternative coating method within the scope of the invention, the PWB substrate is moved horizontally by rollers or other transport mechanism, and the coating solution is sprayed onto both sides of the substrate. There are also one or more brushes which contact the substrate after the spraying of the solution onto the substrate. The brushes assist in achieving full wetting of small features such as microvias and other electrical interconnect recesses. Because full wetting is achieved by the mechanical action of the brushes, surfactants can optionally be eliminated or reduced, and the foaming issues surfactants can present can be eliminated or reduced. Alternative devices such as sponges or squeegees which mechanically assist wetting may be used. Accordingly, this embodiment involves sequentially applying a Ag plating solution comprising a source of Ag ions, and mechanically assisting the Ag plating composition into the electrical interconnect recesses by, for example, contacting the surface with a brush to brush the Ag plating into electrical interconnect recesses.

After contact of the bare board with the solution, the board is rinsed with DI water and dried. Drying may be by any means, but is generally using warm air, for example treated metal may be passed through a drying oven.

The coating obtained using the method of the present invention produces a surface which is considerably more uniform and even than that obtained in the conventional HASL processes. Furthermore, the process of this invention is less expensive and simpler than use of the nickel/gold process.

In the subsequent component-attachment stage, the components are soldered onto the plated pads and/or throughholes of the bare board. The metal of the pad(s) and/or through-holes (generally copper) and plating metal, usually silver, and solder may tend to intermix. The bond formed with the components has good electrical conductivity and good bond strength.

After component attachment, finished boards having components attached over the plated layer of the present invention, do not suffer joint reliability problems as do those boards formed using a nickel/gold step. This invention has been found to provide considerable advantages in preventing tarnishing and conferring humidity resistance on the bare boards produced so that additional protection is provided between the bare board manufacture stage and the component-attachment stage. Solderability is found to be enhanced.

The invention is further illustrated by the following examples:

EXAMPLE 1

Laminated Cu panels (3 cm×5 cm) were prepared by cleaning, etching, and pre-dip per manufacturers' recommended procedures. Panels were plated in accordance with a process of the invention, employing a plating composition with the following components:

| | |
|---|---|
| AgNO3 | 0.79 g/L |
| HEDTA | 10 g/L |

-continued

| | |
|---|---|
| benzimidazole | 1 g/L |
| 3,5 dinitrohydroxy benzoic acid | 0 g/L |
| non-ionic surfactant EO/PO block co-polymer | 1 g/L |
| polyethyleneglycol | 0 g/L |
| HNO$_3$ | 0.98 g/L |
| D.I. water | balance |

The operating pH began at about 2.

Additional panels were plated with Ag by a process not of the invention employing a commercially available plating composition. The operating pH began at less than 1.

Figure 2:
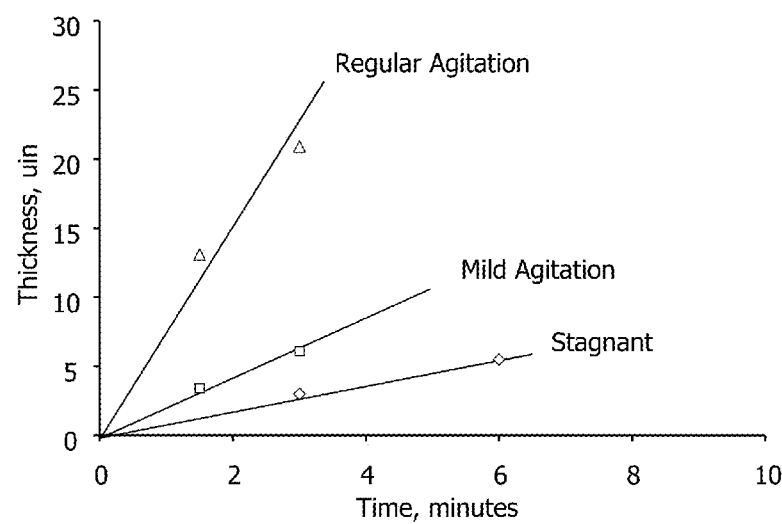

To encompass the various hydrodynamic conditions from production lines, plating was conducted at three agitation conditions: stagnant, mild agitation, and regular agitation (estimated linear speeds of 0, 1.6, and 3.2 cm/s, respectively). Samples were plated for different lengths of time to generate a wide range of silver thickness. Panels of laminated copper (3 cm×5 cm) were plated to determined silver thickness, coating uniformity, and tarnish resistance. The silver coating thickness was measured by using a CMI 900 X-ray Fluorescence System from Oxford Instruments, with the results presented in FIG. 1 (process of the invention) and FIG. 2 (process not of the invention). FIGS. 1 and 2 show the Ag coating thickness as a function of plating time and agitation conditions. Under the plating conditions employed, the process not of the invention (FIG. 2) is about 50% faster than the process of the invention (FIG. 1). For both processes, the thickness increases linearly with time under a given agitation condition within the various plating duration. These data also show that the silver thickness and the deposition rate increases with agitation.

The agitation dependence is consistent with a conclusion that the reaction is controlled by the cathodic reaction, e.g., reduction of Ag ions.

EXAMPLE 2

Figure 3A:
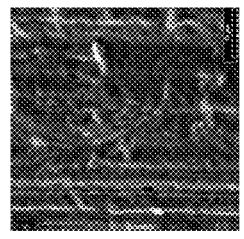
FIGS. 3A, 3B, 3C, 4A, 4B and 4C are 2000× photomicrographs of Ag coatings.
Figure 3B:
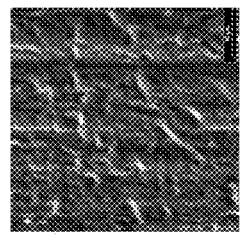
Figure 3C:
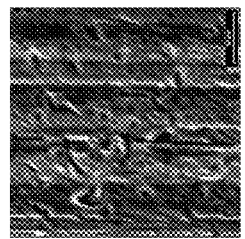
Figure 4A:
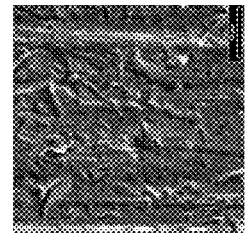
Figure 4B:
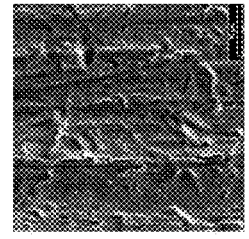
Figure 4C:
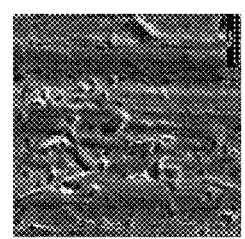

The panels of Example 1 were examined under scanning electron microscope (SEM) and photomicrographs were taken. FIG. 3 (3A, 3B, 3C) shows Ag coatings not of the invention taken at 2000× magnification of panels representing the following three data points of FIG. 1:

FIG. 3A: 3 µin thick; 3 mins.; stagnant
FIG. 3B: 13 µin thick; 1.5 mins.; agitation
FIG. 3C: 21 µin thick; 2 mins.; agitation
FIG. 4 (4A, 4B, 4C) shows Ag coatings of the invention taken at 2000× magnification of panels representing the following three data points of FIG. 2:
FIG. 4A: 4 µin thick; 6 mins.; stagnant
FIG. 4B: 6 µin thick; 2 mins.; mild agitation
FIG. 4C: 8 µin thick; 2 mins.; agitation These figures show that the coating morphology remains unchanged as the thickness increases and conditions otherwise change for both processes. The Ag from the process of the invention (FIG. 4) appears to have a finer grain structure, which was confirmed by X-ray diffraction.

EXAMPLE 3

Figure 5C:
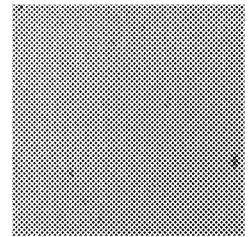
FIGS. 5A, 5B, 5C, 6A, 6B, 6C, 7A, 7B, 7C, 8A, 8B and 8C are Ag coating tarnish test photographs.
Figure 6C:
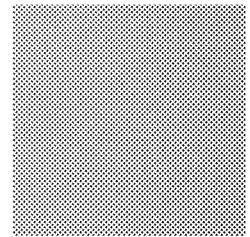
Figure 5B:
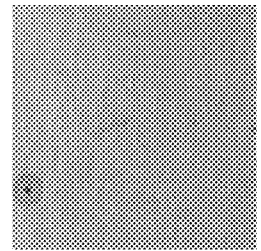
Figure 6B:
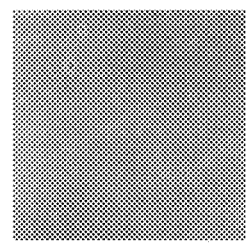
Figure 5A:
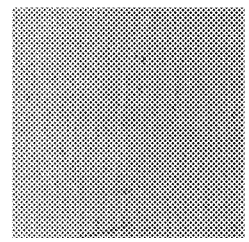
Figure 6A:
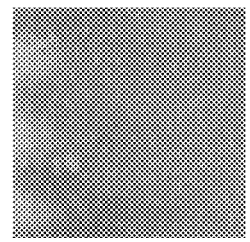

Tarnish resistance was evaluated by visual inspection after exposure to conditions of 85 C and 85% RH (relative humidity) for 24 hours. FIG. 5 shows Ag coatings of the invention on test panels representing the following process conditions:

FIG. 5A: 4 µin thick; 6 mins.; stagnant
FIG. 5B: 5 µin thick; 2 mins.; mild agitation
FIG. 5C: 12 µin thick; 3 mins.; agitation
FIG. 6 shows Ag coatings not of the invention representing the following conditions:
FIG. 6A: 3 µin thick; 3 mins.; stagnant
FIG. 6B: 6 µin thick; 3 mins.; mild agitation
FIG. 6C: 21 µin thick; 3 mins.; agitation These photos show that the Ag coating is heavily tarnished at thicknesses of 3 and 6 µin applied by the comparative process, while the Ag coating is only slightly tarnished for all thicknesses 4, 5, and 12 µin applied by the process of the invention.

EXAMPLE 4

Tarnish resistance was evaluated by a hydrogen sulfide test specially designed to reveal porosity by modifying the Western Electric corrosion test (Manufacturing Standard 17000, Section 1310, Issue 1, June 1982). In this work, 1 ml of ammonium sulfide (reagent grade 20 wt % ammonium sulfide) was added to 100 ml deionized water in a 2-liter clean desiccator and the solution was gently agitated to have a uniform mixture. The samples were placed on a holder, and then put on a clean and dry porcelain supporter in a desiccator above the ammonium sulfide solution at 24 C (+/−4 C). The desiccator was capped for 2 minutes. After the test, the samples were removed from the desiccator for visual and microscopical examination.

Figure 7C:
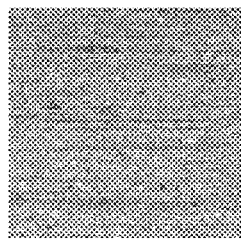
Figure 7B:
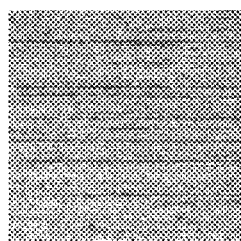
Figure 7A:
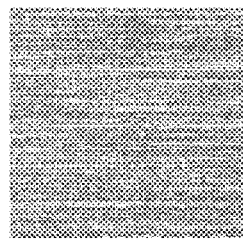
Figure 8C:
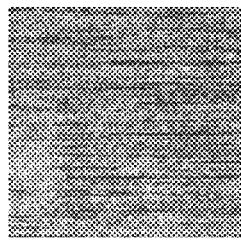
Figure 8B:
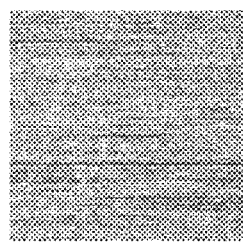
Figure 8A:
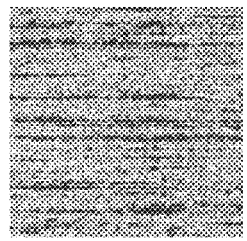

FIG. 7 shows the test panels after the hydrogen sulfide test representing Ag coatings of the invention deposited under the following process conditions:
FIG. 7A: 4 µin thick; 6 mins.; stagnant
FIG. 7B: 5 µin thick; 3 mins.; mild agitation
FIG. 7C: 12 µin thick; 3 mins.; agitation
FIG. 8 shows comparative Ag coatings not of the invention representing the following conditions:
FIG. 8A: 3 µin thick; 3 mins.; stagnant
FIG. 8B: 6 µin thick; 1.5 mins.; agitation
FIG. 8C: 21 µin thick; 3 mins.; agitation These show that the degree of tarnishing decreases as the Ag thickness increases, and the Ag coatings of the invention outperform those from the comparative process of comparable thickness. The areas with scratches are more prone to tarnishing for both processes.

EXAMPLE 5

For surface analysis, Auger electron measurements were carried out with a Physical Electronics Model 600 Scanning Auger Microprobe, which was equipped with a LaB6 filament and a single pass cylinder mirror analyzer (CMA). The beam energy used was 3 KeV and the beam size was about ~5 µm at the largest objective aperture used in the experiments. The sampling depth was about 40 Å for a metallic substrate at an electron energy of 400 eV. The system was also equipped with a differentially pumped ion gun for the sample cleaning and depth profile analysis. The sputtering rate was about 5.4 nm/min, calibrated by using a SiO$_2$ film on Si.

Figure 9:
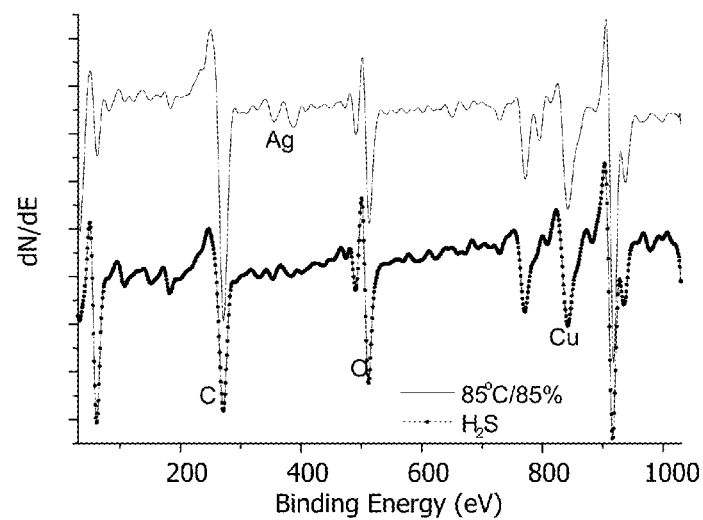
FIGS. 9 and 10 are Auger profiles.
Figure 10:
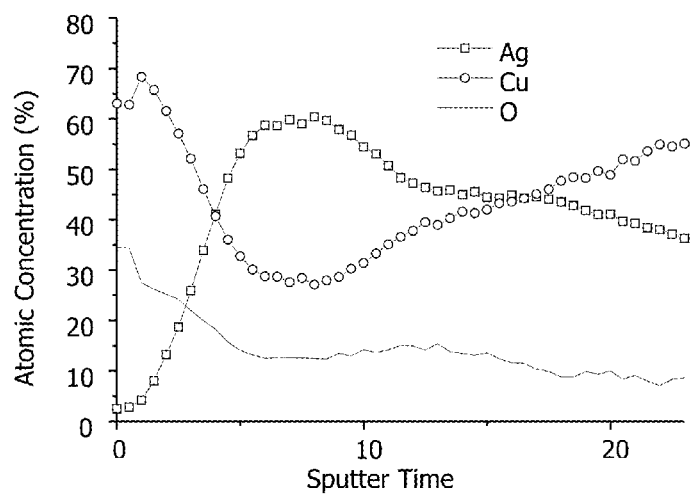

FIG. 9 shows the Auger electron surface analysis for the silver deposited by the comparative process. The upper plot is taken after the humidity test and is of the Ag deposited to 3.4 µin. The second plot is taken after the H$_2$S test and is of the Ag deposited to 13 µin. In both cases, the surface is covered with C, 0, and Cu and a very small amount of Ag. FIG. 10 shows the Auger depth profile of the 3.4 µin sample after the humidity test. On the surface, there are about 63 atomic % Cu, 34% 0, and 2-3% Ag. The relative amounts of Cu and O suggest that copper exist as $Cu_2O$ on the surface. The profile also shows inter-diffusion between Cu and Ag. Because of the low solubility of Cu in Ag, the diffusion of Cu is unlikely through the bulk of Ag grains, but via the grain boundaries and/or the pores in the Ag. When a PWB is exposed to an atmosphere that is corrosive to both Cu substrate and Ag deposit, the atmosphere penetrates through the defects, such as pores and grain boundaries in the Ag coating, and attacks the Cu underneath. Thus, the tarnishing resistance depends not only on the thickness of Ag but also on the porosity and structure of the Ag deposit.

EXAMPLE 6

Solderability was evaluated by a wetting balance test. Coupons plated with Ag as in Example 1 were environmentally aged at 85 C/85% RH for 24 hours before the wetting balance test. Some coupons were treated with up to five reflow cycles prior to the test. The reflow was conducted in air by using a BTU TRS combination IR/forced convection reflow oven with a Pb-free temperature profile, i.e., $T_{peak}=262$ C. The wetting balance test was conducted per IPC/EIA J-STD-003A section 4.3.1 [Joint Industry Standard: Solderability Tests for Printed Boards, IPC/EIA J-STD-003A, February 2003] by using a Robotic Process Systems Automated Wetting Balance Tester with SLS 65 C (alcohol based, 2.2% solid, no-clean) flux and SnPb (63% Sn) solder.

Figure 11:
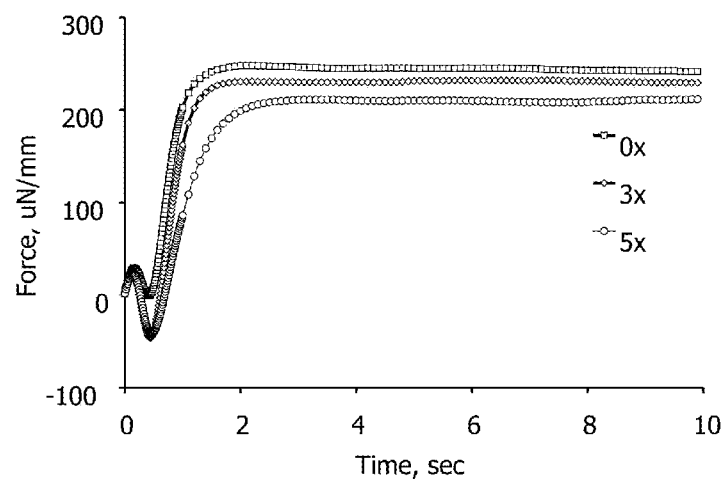
FIG. 11 is a plot of solderability wetting balance data.

The results of wetting balance tests of nine Ag coatings deposited in accordance with the invention in the thickness range of 2.8 to 12.3 μin produced from various operating conditions are summarized in Table 1. The results include the parameters of Ctime to zero buoyancyC ($T_0$), "Cwetting force at two seconds from start of test" ($F_2$), "wetting force at five seconds from start of test" ($F_5$), "maximum wetting force" ($F_{max}$), and "time to ⅔ of the maximum wetting force" ($T_{2/3max}$).

reflow thermal excursions is exemplified in FIG. 11. In general, as the number of reflows increases, $T_0$ gradually increases and the wetting forces ($F_2$, $F_5$ and $F_{max}$) slightly decrease. The good solderability exhibited by the samples of 2.8 and 3.8 μin Ag indicates preservation of solderability even at low thicknesses.

EXAMPLE 7

Surface insulation resistance (SIR) and electromigration tests were conducted on coupons plated with Ag in accordance with the invention as in Example 1 using an IPC-25-B comb pattern (0.0125-inch space). To accentuate the possibility of electromigration of a thick Ag finish, three thicknesses of 6, 12, and 20 μin (as measured on the large land area of the comb) were tested. Twelve measurements (four on each of the three combs) were taken for each material tested. The coupons were exposed to 85 C/85% RH without bias for 96 hours for the SIR test. At the end of the SIR test, a 10-volt bias was applied for 500 hours for the electromigration test. The resistance was measured under a 100-volt bias.

Figure 12:
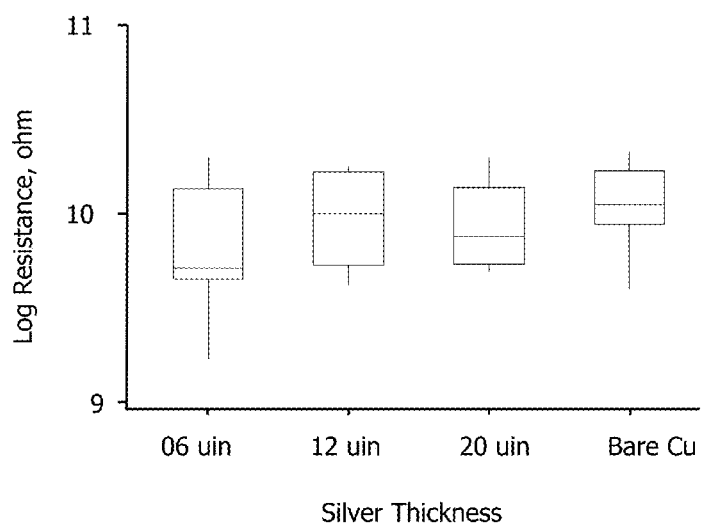
FIGS. 12 and 13 are box-whisker plots of surface insulation resistance and electromigration resistance.

FIG. 12 shows the box-whisker plots of surface insulation resistance measured after 96-hour exposure to 85 C/85% RH. For the three silver thicknesses (6, 12 and 20 μin) tested, the individual resistance is in the range of $4 \times 10^9$ to $2 \times 10^{10}$ ohms (4-20 Gohms), independent of the Ag thickness, and comparable to that of the bare Cu. These results show that the coatings in accordance with the invention are ionically clean.

Figure 13:
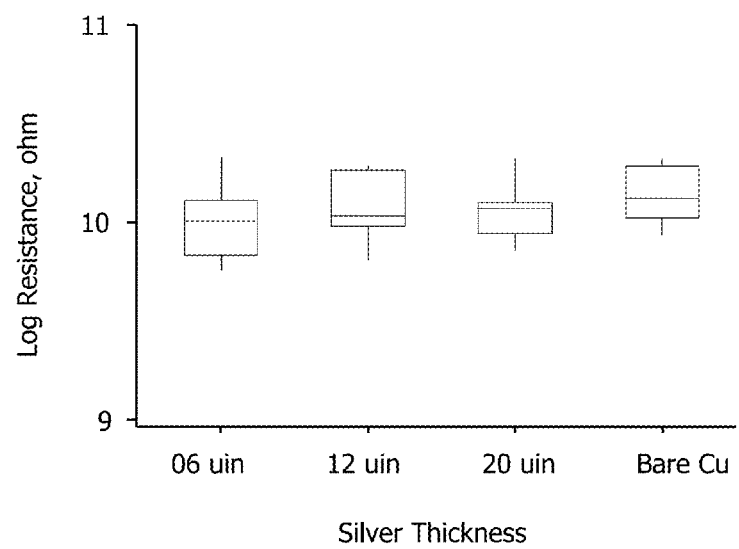
Figure 15:
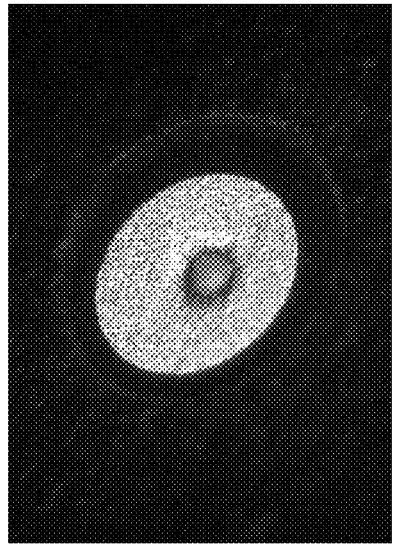
Figure 16:
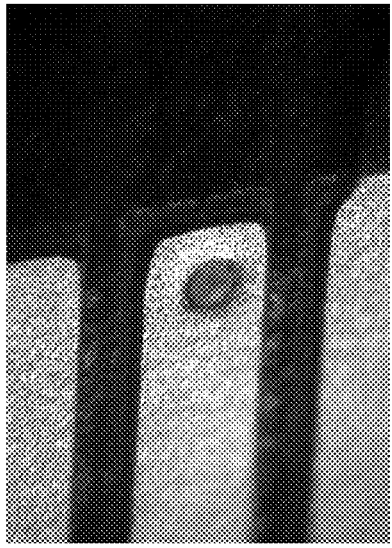
Figure 17:
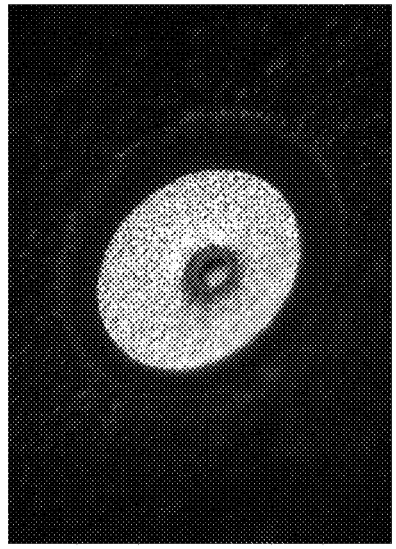
Figure 18:
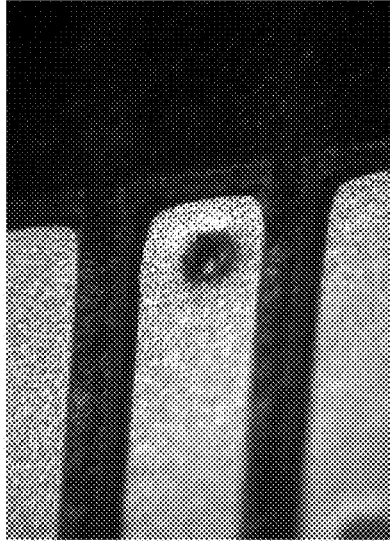
Figure 20:
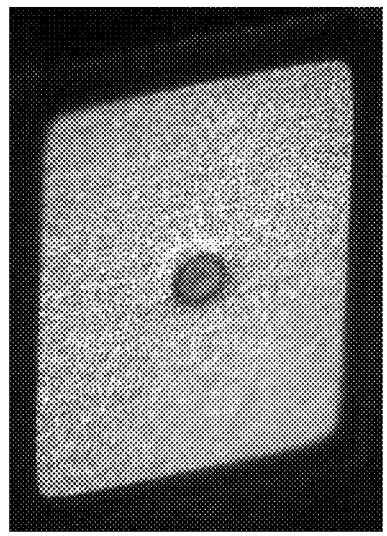
Figure 22:
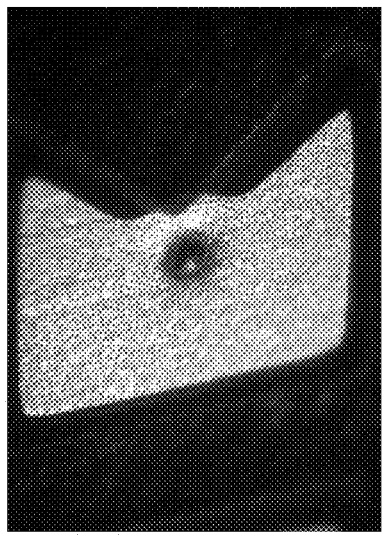
Figure 19:
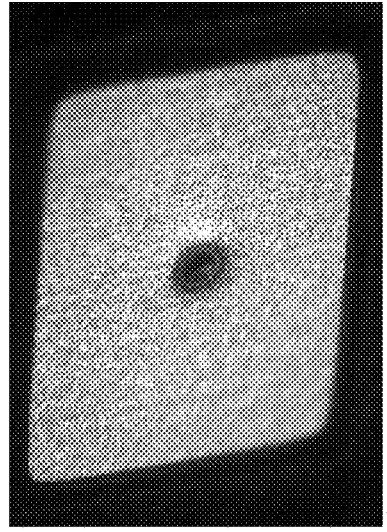
Figure 21:
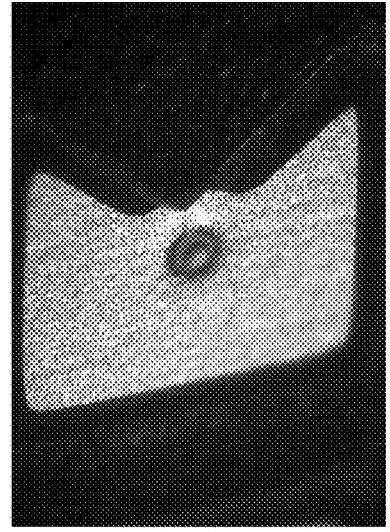
Figure 23:
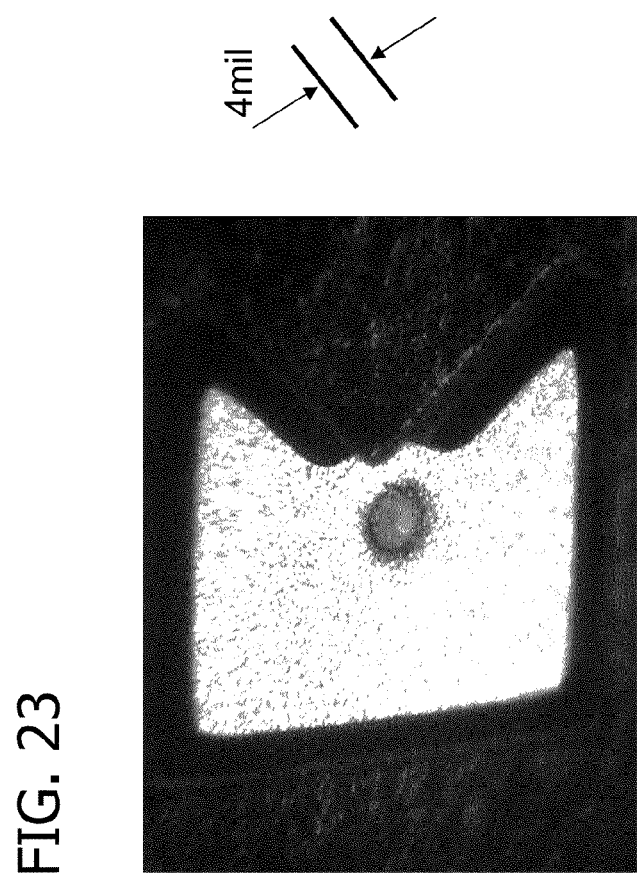

FIG. 13 shows the box-whisker plots of electromigration resistance after 500-hour exposure to 85 C/85% RH under a 10-volt bias. The resistance measured on the three Ag thicknesses is about 10 Gohms (1010 ohms), greater than the values measured at the beginning of the test as shown in

TABLE 1

Results of wetting balance tests for Process B samples conditioned for 24 hours in 85 C./85% RH, and followed by five times Pb-free reflow treatment (5X).

| | Agitation | No | | | Mild | | | Regular | | |
|---|---|---|---|---|---|---|---|---|---|---|
| Plating | Time (min) | 3 | 6 | 9 | 1.5 | 3 | 4.5 | 1 | 2 | 3 |
| | Ag (μin) | 2.8 | 5.2 | 7.9 | 3.8 | 6.6 | 10.3 | 5.5 | 9.5 | 12.3 |
| 24 hrs | $T_o$ (sec) | 0 | 0 | 0 | 0 | 0 | 0.5 | 0.5 | 0.41 | 0.47 |
| | $F_2$ (μN/mm) | 248 | 243 | 229 | 244 | 248 | 253 | 204 | 247 | 235 |
| | $F_5$ (μN/mm) | 252 | 243 | 247 | 254 | 242 | 255 | 208 | 272 | 240 |
| | $F_{max}$ (μN/mm) | 254 | 253 | 256 | 260 | 252 | 256 | 229 | 285 | 250 |
| | $T_{2/3max}$ (sec) | 0.82 | 0.85 | 0.90 | 0.80 | 0.84 | 0.91 | 1.00 | 0.90 | 0.84 |
| 24 hrs 85/85 + 5X | $T_o$ (sec) | 0.88 | 0.81 | 0.91 | 0.77 | 0.69 | 0.73 | 1.2 | 0.62 | 0.84 |
| | $F_2$ (μN/mm) | 151 | 178 | 168 | 170 | 199 | 218 | 69 | 244 | 154 |
| | $F_5$ (μN/mm) | 173 | 193 | 200 | 198 | 210 | 225 | 100 | 230 | 237 |
| | $F_{max}$ (μN/mm) | 182 | 202 | 200 | 211 | 212 | 225 | 119 | 249 | 237 |
| | $T_{2/3max}$ (sec) | 1.60 | 1.40 | 1.60 | 1.60 | 1.30 | 1.20 | 2.60 | 1.10 | 1.10 |

After being conditioned in 85 C/85% RH for 24 hours, all nine coatings, regardless of the thickness and plating conditions, remain tarnish-free and demonstrate excellent solderability, i.e., $T_0<1$ second, and $F_2>200$ μN/mm. The solderability is relatively independent of the thickness and the plating conditions over the range studied. Wetting occurs instantaneously ($T_0=0$) for thinner coatings, but takes about 0.5 second for thicker coatings.

The "5x" results in Table 1 show that after five reflow treatments, except for one sample plated for one minute with regular agitation, the eight other samples still demonstrate good solderability, $T_0<1$. The effect of multiple Pb-free FIG. 12. No evidence of electromigration (or whisker) was found upon examination of the samples, as shown in FIG. 14 (14A, 14B, 14C).

EXAMPLE 8

A variety of substrates with various configuration Cu pads and vias (<4 mils (0.1 mm)) were plated by the silver immersion process of the invention involving agitation, and immersion for three minutes in a plating bath of the same composition as in Example 1, with the addition of 150 ppm 3,5 dinitrohydroxy benzoic acid.

Photomicrographs (FIGS. 15-23) illustrate uniform Ag coverage of the pads and vias.

EXAMPLE 9

Solderability was evaluated by a wetting balance test. Coupons plated with Ag (17 microinches) as in Example 1 with the composition of Example 8 were environmentally aged at 85 C/85% RH for 24 hours before the wetting balance test. Some coupons were treated with up to six reflow cycles prior to the test. The reflow was conducted in air by using a BTU TRS combination IR/forced convection reflow oven with a Pb-free temperature profile, i.e., $T_{peak}$=262 C. The wetting balance test was conducted per IPC/EIA J-STD-003A section 4.3.1 [Joint Industry Standard: Solderability Tests for Printed Boards, IPC/EIA J-STD-003A, February 2003] by using a Robotic Process Systems Automated Wetting Balance Tester (KWB-1000) with SLS 65 C (alcohol based, 2.2% solid, no-clean) flux and SnPb (63% Sn) solder (T=232 C), as well as SAC (Sn—Ag—Cu) 305 solders (T=260 C).

Figure 24:
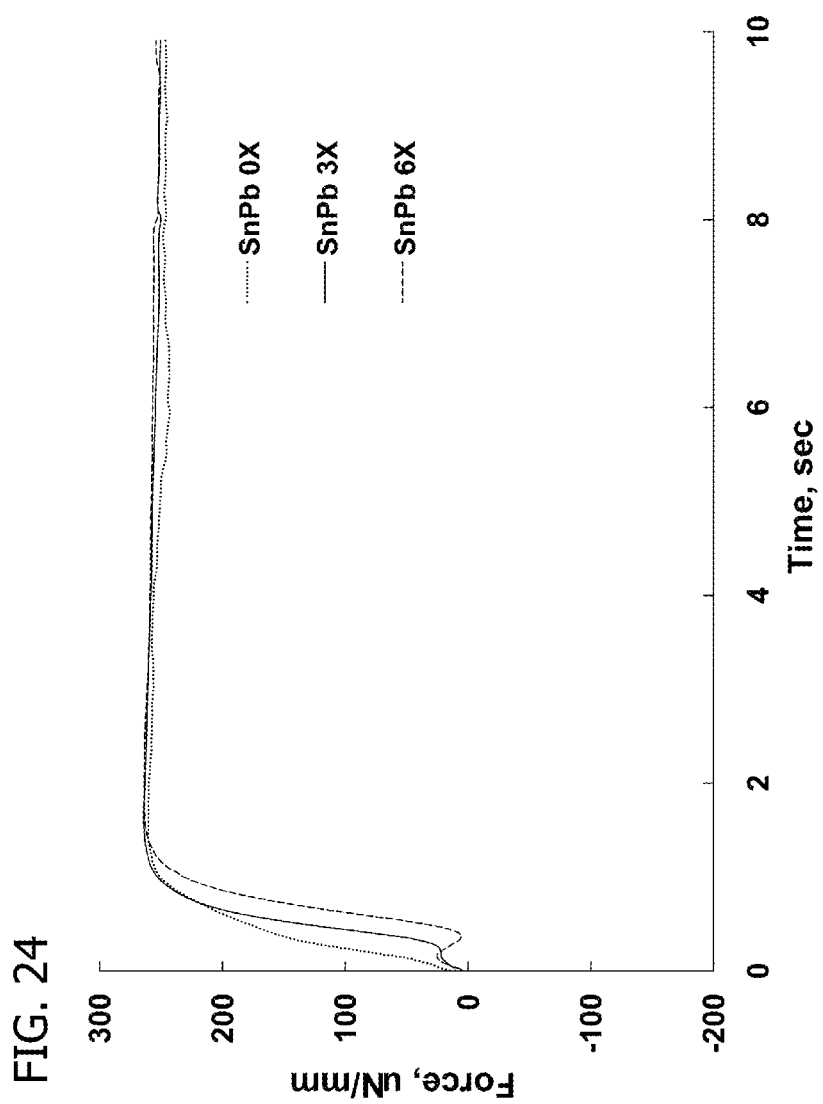
FIGS. 24 and 25 are plots of solderability wetting balance data.
Figure 25:
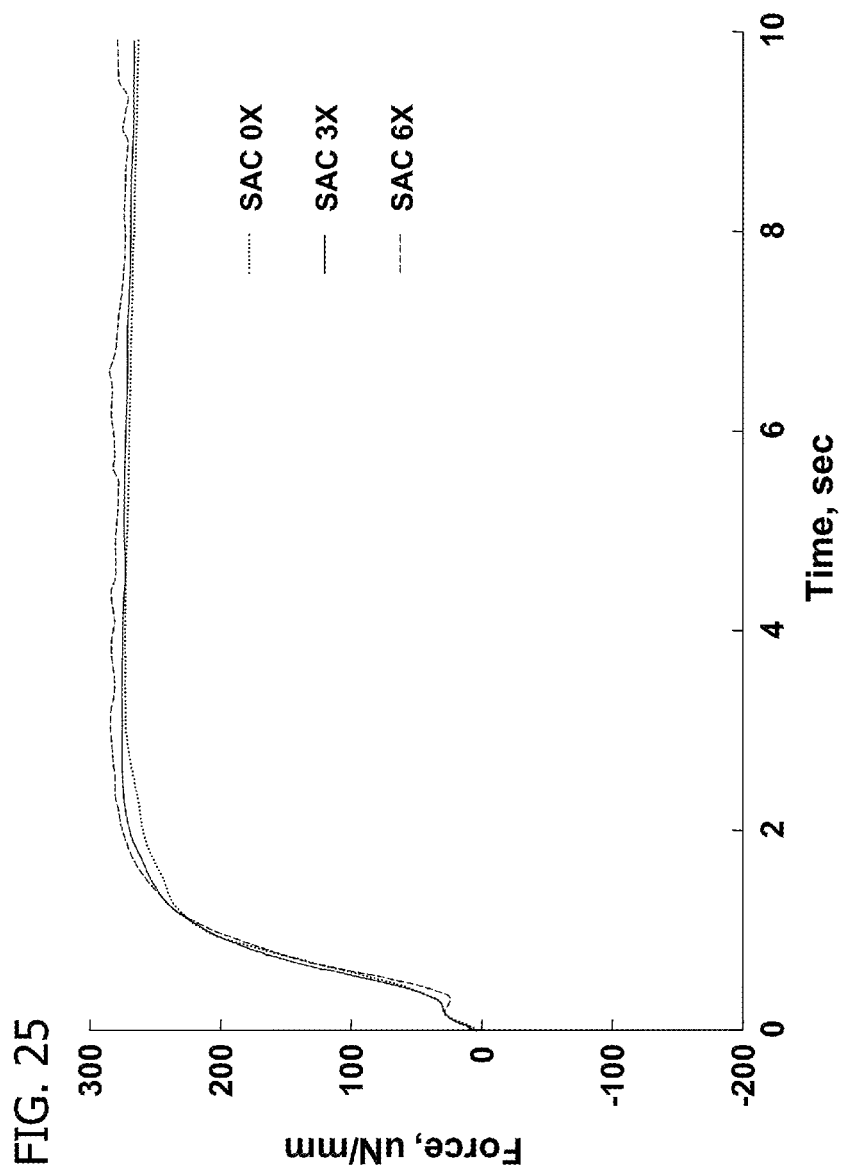

The effect of multiple Pb-free reflow thermal excursions on SnPb solder is exemplified in FIG. 24. The effect of multiple Pb-free reflow thermal excursions on SAC solder is exemplified in FIG. 25. Solderability is excellent in both solders, with instantaneous wetting and high wetting force. The silver is resistant to conditioning and shows little change in solderability. The good solderability exhibited by the samples indicates preservation of solderability.

EXAMPLE 10

Figure 26:
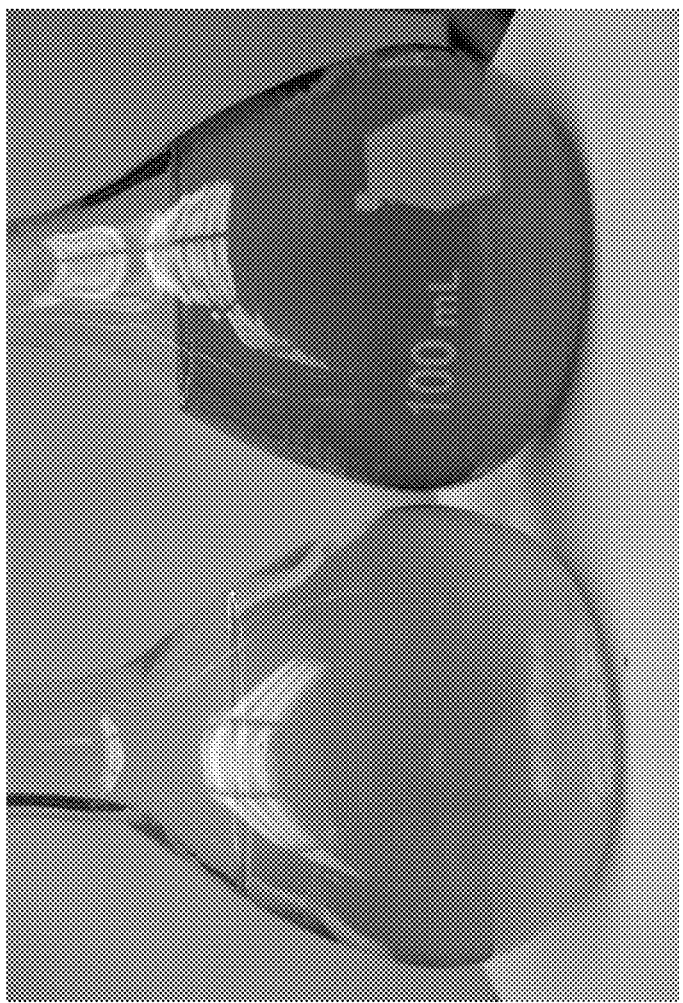
FIG. 26 depicts Ag plating solutions and FIG. 27 is a plot of Ag content of such solutions over time.
Figure 27:
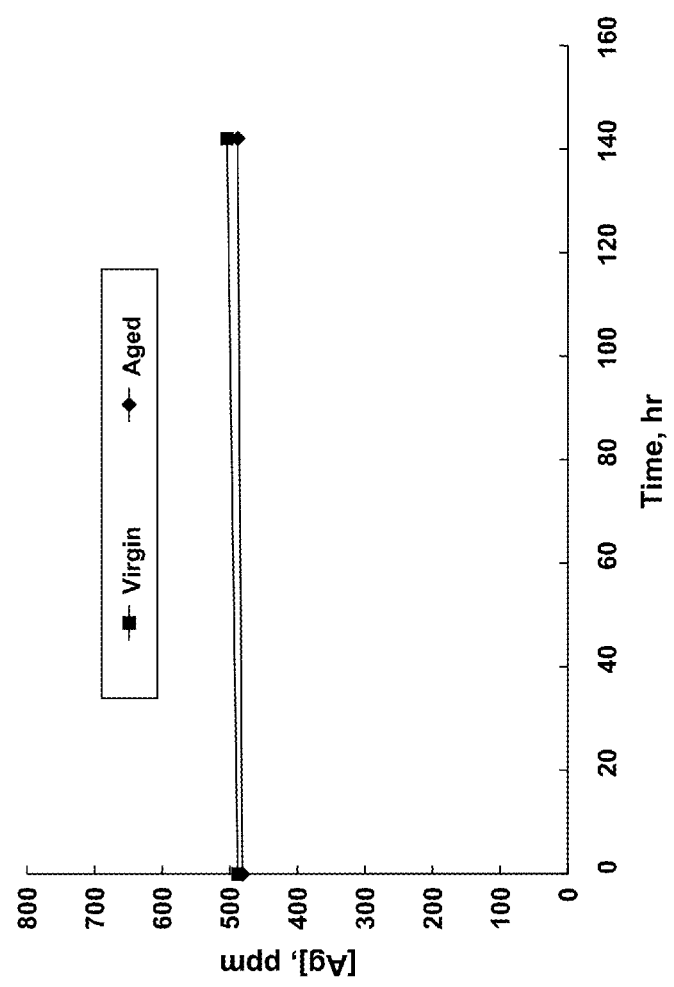

To determine the stability of the compositions of the invention, two baths were prepared in 100 ml volumetric flasks. One with no added Cu (i.e., virgin), and a second with 0.75 g/L added Cu (i.e., simulation aged). The baths were heated at 50 C for 7 days (142 hrs). The Ag content was measured by ICP (inductively coupled plasma) spectrometry. The photographs in FIG. 26 (left photograph—virgin; right photograph—aged) taken after the heating period reveal the baths remained stable, as there was no precipitation or separation. The Ag composition plots in FIG. 27 illustrate that the Ag content remained stable in both baths, with no loss of Ag, over the 7-day period. The Ag baths of the invention therefore remain stable at an operating temperature of 50 C.

EXAMPLE 11

Figure 28:
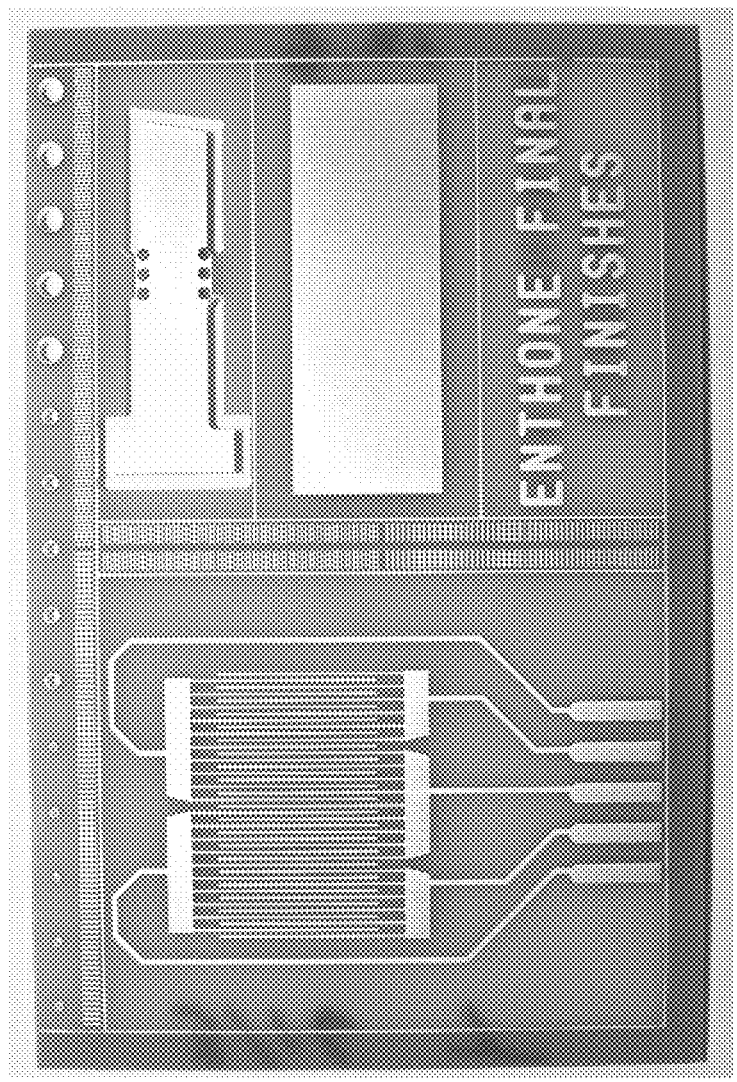
FIG. 28 is a photograph of a PWB after a dry bake test.

Tests were conducted to determine the resistance of the Ag deposit of the invention to tarnishment and discoloration upon dry baking. PWB coupons plated with the composition of the invention were oven-baked at 160 C for 2 hours. The photograph in FIG. 28 shows that there was no change in appearance of the PWB after the dry bake.

EXAMPLE 12

The compositions were analyzed to determine bath efficacy over 18 metal turn overs, i.e., after replenishment of a 0.5 g/L Ag content of the bath 18 times. PWB coupons were plated continually through 18 metal turn overs (9 g/L), the deposits were examined by SEM (scanning electron microscopy) and XPS (X-ray photoelectron spectroscopy), and porosity was evaluated by H$_2$S analysis. The SEM photomicrographs of FIG. 29 (29A, 29B, 29C) show that over continual replenishment, the Ag deposit appears to become coarser, but remains of high integrity. The optical photomicrographs of FIG. 30 (30A, 30B, 30C) show that over continual replenishment, there is no significant increase in porosity upon H$_2$S testing. XPS analysis revealed that after 0.6 MTO, the coating was 93.6 at % Ag, 3.2 at % C, and 3.2 at % 0. After 18 MTO, the coating was 91.8 at % Ag, 2.3 at % C, and 5.9 at % O. The bath is thereby demonstrated to be capable of processing 28.7 m$^2$ PWB per liter, at 0.2 micron Ag thickness, 15% Cu coverage of the PWB, and an assumption of no drag out of solution (although in production, drag out cannot be prevented).

EXAMPLE 13

Figure 31:
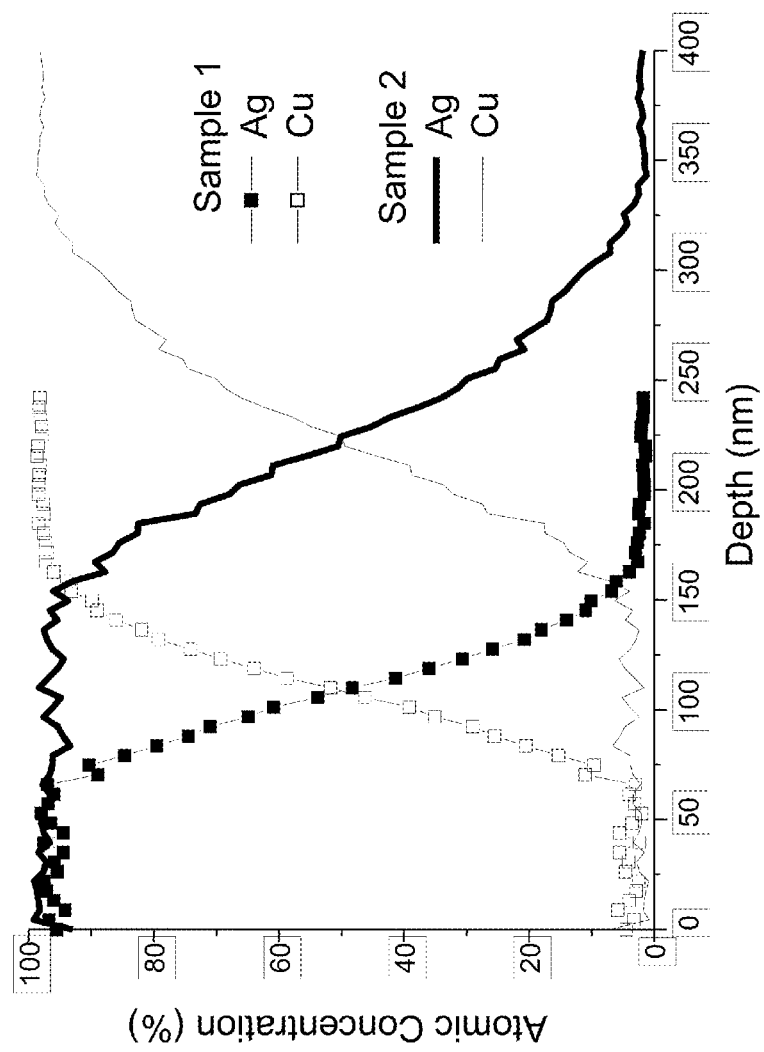
FIG. 31 is a graph of Auger data.
Figure 32:
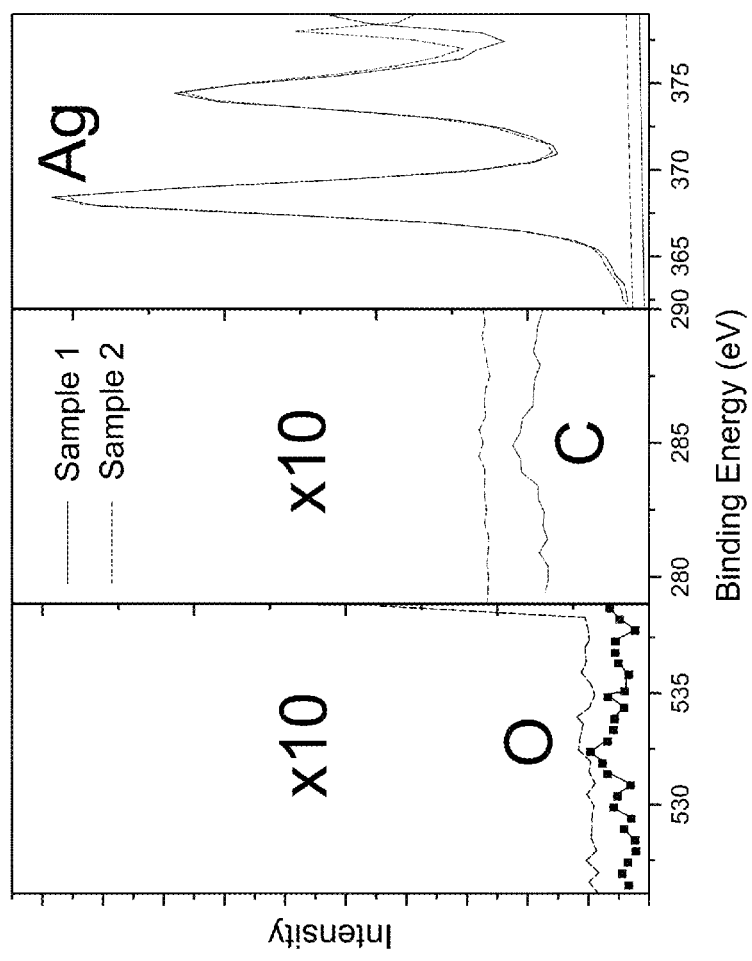
FIG. 32 is a graph of XPS data.

X-ray photoelectron spectroscopy (XPS) was employed to determine carbon content in Ag deposited in accordance with the invention in comparison to a commercially available process and composition. Sample 1 according to the invention with Ag deposited employing a composition with 375 ppm Ag, at 49 C, and no agitation, to produce a 6.5 microinch thick deposit in three minutes demonstrated a coating with 93 at % Ag, 5.9 at % C, and 1.1 at % 0. Sample 2 according to the invention with Ag deposited employing a composition with 650 ppm Ag, at 54 C, and agitation, to produce a 14.5 microinch thick deposit demonstrated a coating with >97.5 at % Ag, <1.5 at % C, and <1 at % O (O and C below the detection limit). A comparative sample with Ag deposited by a commercially available composition demonstrated a coating with 73 at % Ag, 22.5 at % C, and 4.6 at % 0. This demonstrates that the process and composition of the invention yield an improved composition Ag deposit containing greater that 90 at % Ag. Supporting Auger data for Samples 1 and 2 are presented in FIG. 31. Supporting XPS data for Samples 1 and 2 are presented in FIG. 32.

EXAMPLE 14

Figure 33:
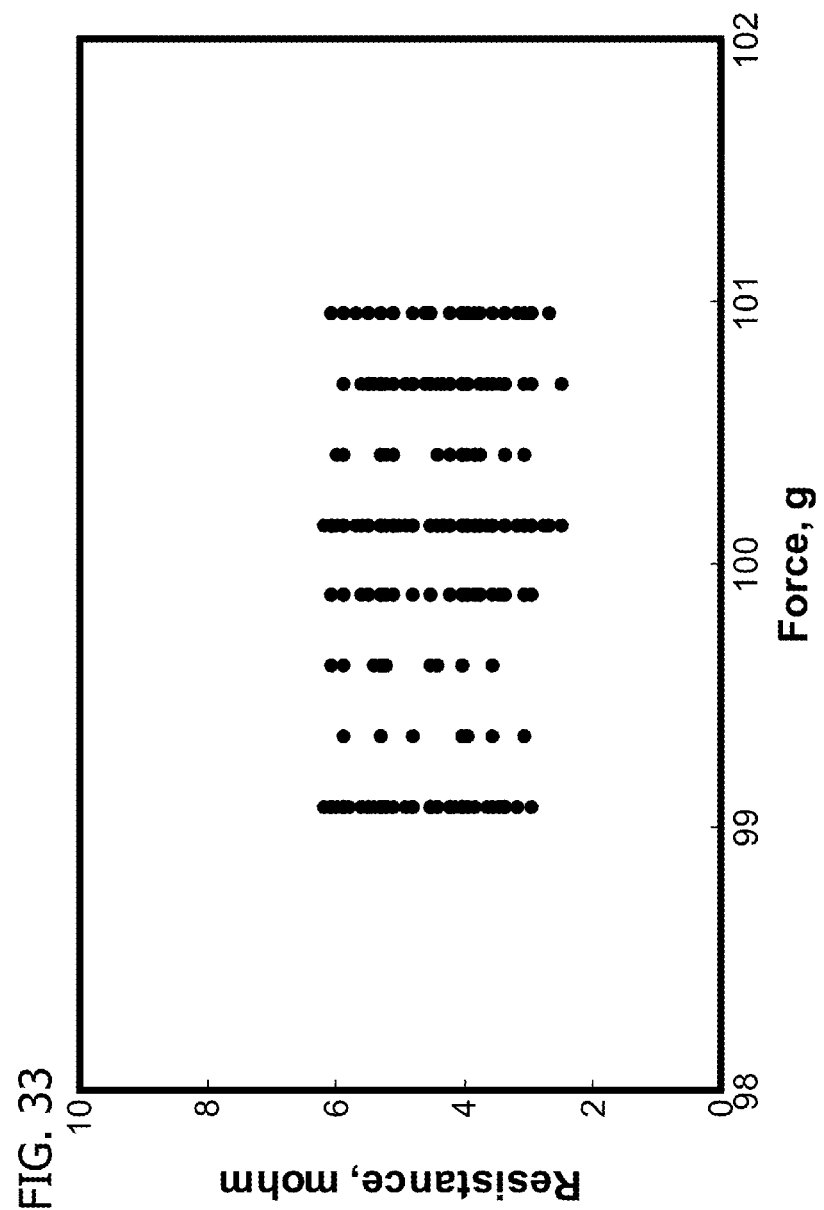
FIGS. 33 and 34 are plots of contact resistance data.
Figure 34:
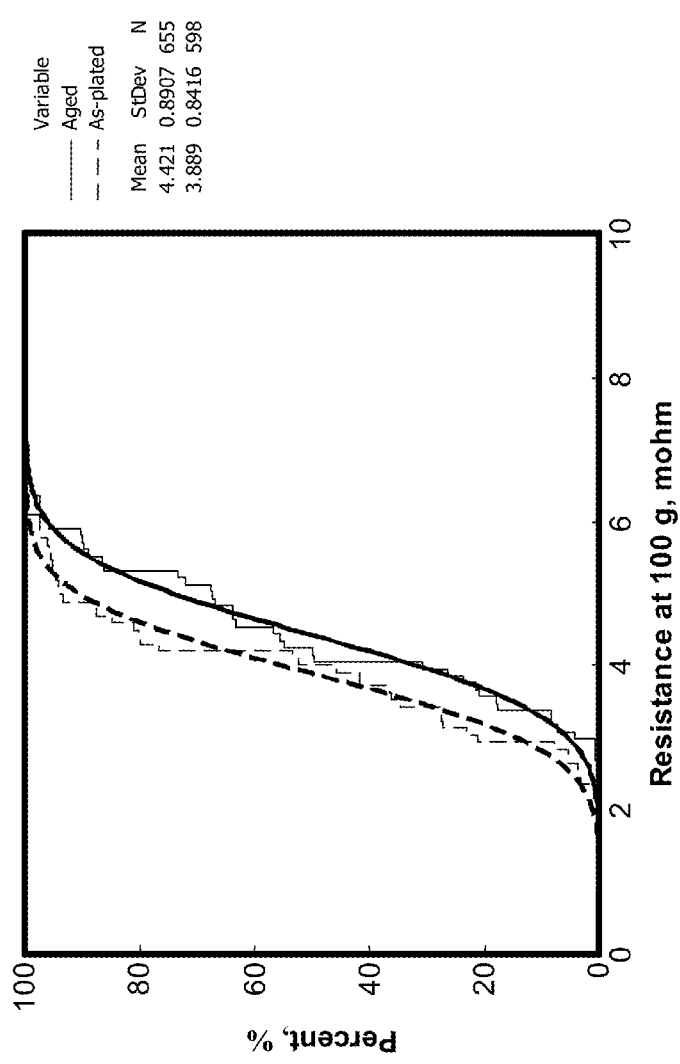
Figure 35B:
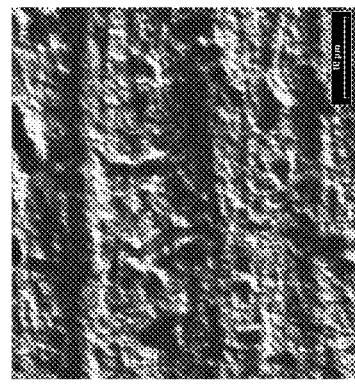
FIGS. 35A, 35B, 35C and 35D present photomicrographs of Ag deposits.
Figure 35D:
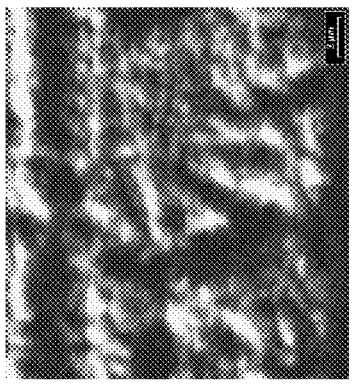
Figure 35A:
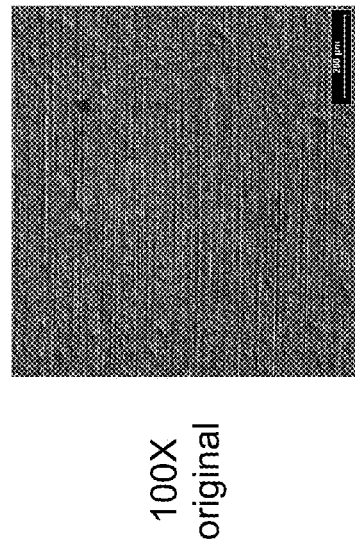
Figure 35C:
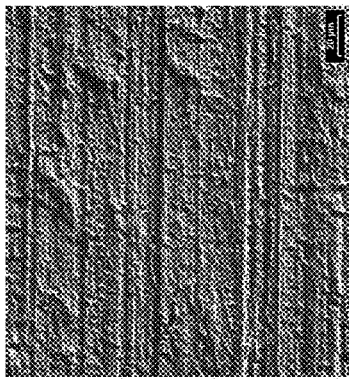

The contact resistance of Ag coatings deposited in accordance with the invention was determined by testing according to ASTM B667-92. An as plated sample with a coating of 7.4 microinches thickness and a sample with a coating 3.8 microinches thickness conditioned for 24 hrs at 85 C/85% RH were tested. Contact resistance was measured using a CETR UMT-2 Multi-specimen tester. The contact was made on a Cu sphere (diameter=4 mm) plated with silver. The force was 20 to 100 grams. FIG. 33 illustrates the contact resistance of measurements from 25 tests of the as-plated sample at 100+/−1 g force. FIG. 34 shows the cumulative distribution of frequency to illustrate the effect of conditioning on contact resistance. These results show that the contact resistance of the Ag deposit is very low ($R_{avg}$<5 mohm at 100 g force), and remains low after conditioning for 24 hrs at 85 C/85% RH.

EXAMPLE 15

Solvent extract conductivity testing was performed to determine the bulk ionic cleanliness of PWBs receiving the Ag coating of the invention. The samples tested were bare Cu PWBs, PWBs coated vertically using the bath of the invention, and PWBs coated horizontally using the bath of the invention. The testing protocol employed an Alpha 600-SMD Omega Meter, a solution of 75% isopropyl alcohol and 25% water, 38 C solution immersion temperature, and a 4 minute stabilization period. The results were as follows:

| Sample | microgram/cm² NaCl equiv |
|---|---|
| Bare PWB 1 | 0.12 |
| Bare PWB 2 | 0.09 |
| Ag Vertical 1 | 0.16 |
| Ag Vertical 2 | 0.31 |
| Ag Horiz. 1 | 0.48 |
| Ag Horiz. 2 | 0.56 |

These results show that the Ag deposits meet the cleanliness requirements of 1 microgram/cm² (6.45 microgram/in²) of NaCl equivalent by the solvent extract conductivity testing. The higher conductivity of the PWBs processed horizontally can be attributed to the required final rinse.

EXAMPLE 16

Laminated Cu panels (3 cm×5 cm) were prepared by cleaning, etching, and pre-dip per manufacturers' recommended procedures. The panels were plated in solutions employing DL-alanine as a modulating agent and 5,5-dimethylhydantoin as a chelator for Cu ions. Solutions were prepared containing $AgNO_3$ (0.5-1 g/L), DL-alanine (20-40 g/L), 5,5-dimethylhydantoin (5-10 g/L), Pluronic P103 (0.5 g/L) and water balance. The pH was about 5. Plating times of 3 minutes yielded a Ag matte coating, white in appearance, between about 13 and 20 microinches thick. Two of the coatings deposited in Example 16 were analyzed by XPS analysis for composition:

| | | 1. Atomic % | | | |
|---|---|---|---|---|---|
| | | b. Ag | C | O | Cl |
| I | surface | 62.3 | 23.4 | 11.3 | 3.1 |
| I | bulk | 98.4 | 1.4 | <0.1 | |
| II | surface | 45.4 | 34.3 | 17.8 | 2.5 |
| II | bulk | 97.9 | 1.6 | 0.5 | |

Photomicrographs of one of the Ag deposits were taken and are presented in FIGS. 35 A-D. Various tests of the previous Examples were performed, including corrosion tests in $H_2S$, tarnish evaluation at 85 C/85 RH, wetting balance tests, and SIR testing. The coatings deposited using this composition were uniform deposits exhibiting excellent adhesion, tarnish resistance, solderability, and electromigration resistance. They exhibited low porosity, good contact resistance, good wear resistance, and good wire bonding.

EXAMPLE 17

The conductivity of four deposition baths was determined with a YSI 3200 Conductivity Instrument, and a YSI 3253 probe with a cell constant of K=1.0/cm. The baths of the invention of Example 8 (Sample 1) and 16 (Sample 2), the bath not of the invention of Example 1 (Sample 3), and a commercially available bath within the invention described in U.S. Pat. No. 6,395,329 (Sample 4):

| i. Conductivity | | |
|---|---|---|
| Sample # | mS/cm | pH |
| 1 | 5.827 | 1.895 @ 22.8 C. |
| 2 | 0.519 | 4.795 @ 22.8 C. |
| 3 | 92 | 0.698 @ 23.1 C. |
| 4 | 30.8 | 6.723 @ 23 C. |

The present invention is not limited to the above embodiments and can be variously modified. The above description of preferred embodiments is intended only to acquaint others skilled in the art with the invention, its principles and its practical application so that others skilled in the art may adapt and apply the invention in its numerous forms, as may be best suited to the requirements of a particular use.

With reference to the use of the word(s) "comprise" or "comprises" or "comprising" in this entire specification (including the claims below), it is noted that unless the context requires otherwise, those words are used on the basis and clear understanding that they are to be interpreted inclusively, rather than exclusively, and that it is intended each of those words to be so interpreted in construing this entire specification.

What is claimed is:

1. A plating composition for Ag plating a metal surface, the composition comprising a source of Ag ions, water, and a modulating agent, wherein the composition has a pH below about 3 and an ionic content such that the composition has a room temperature conductivity below about 10 mS/cm.

2. The composition of claim 1 wherein the composition has an ionic content such that the composition has a room temperature conductivity below about 5 mS/cm.

3. The composition of claim 1 wherein the modulating agent comprises an alkylene polyamine polyacetic acid compound.

4. The composition of claim 3 wherein the alkylene polyamine polyacetic acid compound is from an alkaline earth/alkali metal-free source of alkylene polyamine polyacetic acid compound.

5. The composition of claim 3 wherein the alkylene polyamine polyacetic acid compound is selected from the group consisting of EDTA, DTPA, and HEDTA.

6. The composition of claim 3 wherein the alkylene polyamine polyacetic acid compound comprises N-(2-hydroxyethyl)ethylenediamine triacetic acid from an alkaline earth/alkali metal-free source of N-(2-hydroxyethyl) ethylenediamine triacetic acid.

7. The composition of claim 1 wherein the concentration of the modulating agent is between about 1 and about 25 g/L.

8. The composition of claim 3 wherein the concentration of the alkylene polyamine polyacetic acid compound is between about 1 and about 25 g/L.

9. The composition of claim 6 wherein the concentration of the N-(2-hydroxyethyl)ethylenediamine triacetic acid is between about 1 and about 25 g/L.

10. The composition of claim 7 wherein the concentration of the source of Ag ions is between about 0.1 and about 1.5 g/L.

11. The composition of claim 8 wherein the composition further comprises an ethylene oxide/propylene oxide block co-polymer additive.

12. The composition of claim 9 wherein the composition further an ethylene oxide/propylene oxide block co-polymer additive.

13. The composition of claim 10 wherein the composition further an ethylene oxide/propylene oxide block co-polymer additive.

14. The composition of claim 13 wherein the ethylene oxide/propylene oxide block co-polymer has a unit ratio of PO:EO of 3:4+/−10% or a unit ratio of PO:EO of 5:3+/−10%.

15. The composition of claim 11 wherein the composition further comprises copper nitrate.

16. The composition of claim 13 wherein the composition further comprises copper nitrate up to a concentration of about 0.3 g/L.

17. A plating composition for Ag plating a metal surface, the composition comprising a source of Ag ions, water, and a modulating agent, wherein the composition has a pH below about 3 and an ionic content such that the composition has a room temperature conductivity below about 25 mS/cm.

18. The composition of claim 17 wherein the modulating agent comprises an alkylene polyamine polyacetic acid compound.

19. The composition of claim 18 wherein the composition comprises one or more of the following features:
- the alkylene polyamine polyacetic acid compound is from an alkaline earth/alkali metal-free source of alkylene polyamine polyacetic acid compound;
- the alkylene polyamine polyacetic acid compound is selected from the group consisting of EDTA, DTPA, and HEDTA;
- the alkylene polyamine polyacetic acid compound comprises N-(2-hydroxyethyl)ethylenediamine triacetic acid;
- the alkylene polyamine polyacetic acid compound comprises N-(2-hydroxyethyl) ethylenediamine triacetic acid from an alkaline earth/alkali metal-free source of N-(2-hydroxyethyl)ethylenediamine triacetic acid;
- the concentration of the alkylene polyamine polyacetic acid compound is between about 1 and about 25 g/L;
- the concentration of the source of Ag ions is between about 0.1 and about 1.5 g/L;
- the composition further comprises from about 0.1 to about 5 g/l of a surfactant;
- the composition further comprises a surfactant comprising an ethylene oxide/propylene oxide block co-polymer additive;
- the composition further comprises copper nitrate; and/or
- the composition further comprises copper nitrate up to a concentration of about 0.3 g/L.

20. The composition of claim 17 wherein the composition comprises one or more of the following features:
- the concentration of the modulating agent is between about 1 and about 25 g/L;
- the concentration of the source of Ag ions is between about 0.1 and about 1.5 g/L;
- the composition further comprises from about 0.1 to about 5 g/l of a surfactant;
- the composition further comprises a surfactant comprising an ethylene oxide/propylene oxide block co-polymer additive;
- the composition further comprises copper nitrate; and/or
- the composition further comprises copper nitrate up to a concentration of about 0.3 g/L.

* * * * *